(12) United States Patent
Azzouz et al.

(10) Patent No.: US 12,224,420 B2
(45) Date of Patent: *Feb. 11, 2025

(54) DEVICE FOR THERMAL REGULATION OF AN ELECTRONIC COMPONENT

(71) Applicant: Valeo Systemes Thermiques, Le Mesnil-Saint-Denis (FR)

(72) Inventors: Kamel Azzouz, Le Mesnil Saint Denis (FR); Amrid Mammeri, Le Mesnil Saint Denis (FR); Sébastien Garnier, Le Mesnil Saint Denis (FR); Imad Chelali, Le Mesnil Saint Denis (FR)

(73) Assignee: VALEO SYSTEMES THERMIQUES, Le Mesnil-Saint-Denis (FR)

( * ) Notice: Subject to any disclaimer, the term of this patent is extended or adjusted under 35 U.S.C. 154(b) by 863 days.

This patent is subject to a terminal disclaimer.

(21) Appl. No.: 17/293,701

(22) PCT Filed: Sep. 10, 2019

(86) PCT No.: PCT/FR2019/052095
§ 371 (c)(1),
(2) Date: Dec. 20, 2021

(87) PCT Pub. No.: WO2020/099739
PCT Pub. Date: May 22, 2020

(65) Prior Publication Data
US 2022/0109201 A1    Apr. 7, 2022

(30) Foreign Application Priority Data

Nov. 16, 2018 (FR) .................................. 1860652
May 15, 2019 (FR) .................................. 1905091
(Continued)

(51) Int. Cl.
*H01M 10/65* (2014.01)
*F28D 9/00* (2006.01)
(Continued)

(52) U.S. Cl.
CPC ...... *H01M 10/6568* (2015.04); *F28D 9/0037* (2013.01); *F28F 3/12* (2013.01);
(Continued)

(58) Field of Classification Search
CPC .......... H01M 10/6568; H01M 10/613; H01M 10/625; H01M 10/6554; H01M 10/6556;
(Continued)

(56) References Cited

U.S. PATENT DOCUMENTS 5,522,452 A * 6/1996 Mizuno ............... H01L 23/4336
165/286
5,907,473 A * 5/1999 Przilas ............... H05K 7/20345
174/15.1
(Continued)

FOREIGN PATENT DOCUMENTS

| CN | 101534627 A | 9/2009 |
| CN | 102548780 A | 7/2012 |

(Continued)

OTHER PUBLICATIONS

Office Action issued in counterpart Chinese Patent Application No. CN 201980089328.6 mailed Dec. 4, 2023 (15 pages).
(Continued)

*Primary Examiner* — Tho V Duong
(74) *Attorney, Agent, or Firm* — Osha Bergman Watanabe & Burton LLP

(57) ABSTRACT

The invention concerns a device for thermal regulation (2), in particular cooling, for an electronic component (103), in particular a battery, the temperature of which must be controlled, the electronic component (103) being in particular capable of giving off heat during its operation, the thermal regulation device comprising at least one first circuit (4) configured to allow the circulation of a heat transfer fluid; at least one second circuit (5) configured to transport
(Continued)

Figure 1:
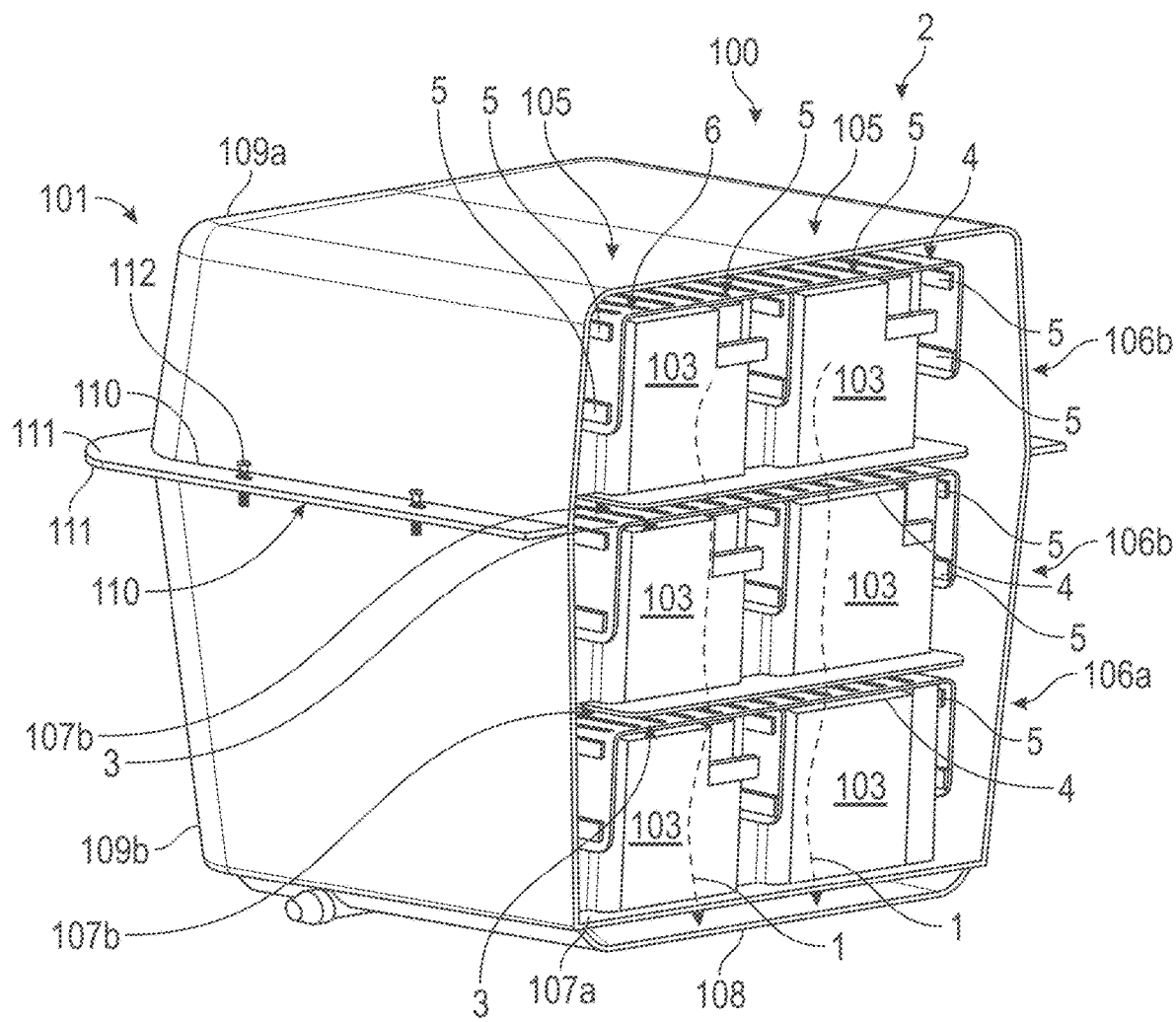

a dielectric fluid, this second circuit comprising at least one outlet for delivering the dielectric fluid towards the electronic component; at least one first circuit (4) and at least one second circuit (5) being arranged so that the first circuit is in thermal interaction with the fluid delivered via the at least one outlet of the second circuit.

18 Claims, 13 Drawing Sheets

(30) Foreign Application Priority Data

May 15, 2019 (FR) ........................................ 1905092
Jun. 18, 2019 (FR) ........................................ 1906505

(51) Int. Cl.
*F28F 3/12* (2006.01)
*H01M 10/613* (2014.01)
*H01M 10/625* (2014.01)
*H01M 10/6554* (2014.01)
*H01M 10/6556* (2014.01)
*H01M 10/6568* (2014.01)
*H01M 10/6569* (2014.01)
*H05K 7/20* (2006.01)
*F28D 21/00* (2006.01)

(52) U.S. Cl.
CPC ....... *H01M 10/613* (2015.04); *H01M 10/625* (2015.04); *H01M 10/6554* (2015.04); *H01M 10/6556* (2015.04); *H01M 10/6569* (2015.04); *H05K 7/20318* (2013.01); *H05K 7/20327* (2013.01); *F28D 2021/0029* (2013.01); *F28F 2250/08* (2013.01); *F28F 2275/04* (2013.01); *H01M 2220/20* (2013.01)

(58) Field of Classification Search
CPC .......... H01M 10/6569; H01M 2220/20; F28D 9/0037; F28D 2021/0029; F28F 3/12; F28F 2250/08; F28F 2275/04; H05K 7/20318; H05K 7/20327; H01L 23/4735
See application file for complete search history.

(56) References Cited

U.S. PATENT DOCUMENTS

| | | | |
|---|---|---|---|
| 5,943,211 A | 8/1999 | Havey et al. | |
| 6,357,517 B1* | 3/2002 | Osakabe | F28D 15/0233 165/104.21 |
| 6,662,859 B2* | 12/2003 | Strahle | H05K 7/20309 361/689 |
| 10,111,367 B2* | 10/2018 | Kodama | H05K 7/20818 |
| 2006/0174643 A1* | 8/2006 | Ostrom | F28D 15/0266 62/119 |
| 2009/0283248 A1* | 11/2009 | Nilsson | H01L 23/4735 165/104.33 |
| 2010/0039773 A1* | 2/2010 | Tilton | H05K 7/20345 361/699 |
| 2018/0145382 A1 | 5/2018 | Harris et al. | |

FOREIGN PATENT DOCUMENTS

CN 203279429 U 11/2013
FR 3037727 A3 12/2016

OTHER PUBLICATIONS

International Search Report with Written Opinion in corresponding International Application No. PCT/FR2019/052094, mailed Jan. 28, 2020 (10 pages).

* cited by examiner

DEVICE FOR THERMAL REGULATION OF AN ELECTRONIC COMPONENT

The present invention relates to the field of devices for thermal regulation of electronic components that may give off heat during operation.

Electronic components, whether electrical storage cells, integrated circuits, servers, data centers, etc. require thermal regulation in order to keep them within their operating temperature range.

Data centers around the world currently account for 10% of global electricity consumption. The advent of blockchain and 5G technologies means that this percentage could increase drastically in the coming years. At least half of this consumption comes from the cooling systems of these data centers. Currently, most data centers are air-cooled by cooling the ambient air in storage rooms with air conditioning devices. The optimum operating temperature for data centers is between 5° C. and 40° C., more specifically around 27° C. Taking into consideration that air has a very low conductivity, in order to sufficiently cool the electronic components, which can reach temperatures exceeding 60° C., the temperature difference between the air and the electronic components to be cooled must be great and therefore this type of device is very energy intensive and bulky.

In the field of motor vehicles, heat treatment devices allow a temperature of an electric battery, an electronic power device or an on-board computer to be modified, and in particular allow the temperature of the electric battery, which tends to heat up during use and in particular while charging, to be reduced. In general, such heat treatment devices for electric batteries use heat exchangers. The various battery cells of a battery system in particular can be cooled by means of a cold plate, inside which a coolant circulates, with the plate being in contact with the battery cells to be cooled. It has been noted that such heat exchangers can lead to non-homogeneous cooling of the electric batteries of the same system of electronic components, which then results in a reduction in the performance capabilities of these electric batteries. These heat treatment devices also exhibit high thermal resistance because of the thicknesses of material present between the coolant and the battery cells.

In order to provide a response to these different problems, several devices are known.

In particular, document FR 3037727 is known, which discloses a device for cooling the electric batteries of electric or hybrid cars. More specifically, this document relates to a device for cooling the cells of the electric batteries of a lithium-ion type battery pack. It comprises a hermetically sealed housing, in which a two-phase fluid circulates, and which has an air layer. The electrical storage cells are partially immersed in the two-phase fluid in order to ensure the heat exchange between the cells and the two-phase fluid. Thus, the electric batteries are cooled by immersing the cells of the electric batteries in said fluid. The reserve of two-phase liquid comprises a tray located outside the housing and connected to said housing in order to allow the two-phase fluid to circulate.

However, immersing the electrical storage cells in a fluid, in particular a dielectric fluid, does not allow homogeneous cooling of the cells.

The aim of the invention is to provide an alternative for thermal regulation of electrical components, in particular batteries, by overcoming the aforementioned problems of the prior art, by proposing a thermal regulation device that lowers and homogenizes the temperature of the electronic component, thus optimizing the lifetime and the performance of such an electronic component, in particular in a system of electronic components for a motor vehicle.

In this context, the present invention relates to a thermal regulation device, in particular a cooling device, for an electronic component, in particular a battery, the temperature of which must be regulated, said electronic component being in particular capable of giving off heat during operation. The thermal regulation device comprises at least one first circuit configured to allow the circulation of a heat transfer fluid, at least one second circuit configured to convey a dielectric fluid, this second circuit comprising at least one outlet for distributing the dielectric fluid in the direction of the electronic component, the thermal regulation device being configured such that at least a portion of the first circuit and at least a portion of the second circuit are in thermal contact with each other.

Thermal contact between portions of circuits means that the two circuits that the thermal regulation device comprises are, in at least one zone of the device, sufficiently close to each other that the first circuit and the heat transfer fluid which circulates within this first circuit can exchange calories with the second circuit and the dielectric fluid which circulates within this second circuit. Proximity of the circuits to one another means that locally, in at least one zone of the device, a portion of the first circuit is in mechanical contact with a portion of the second circuit, or that these portions are at a minimal distance from each other. This minimal distance may in particular be of the order of ten millimeters. More particularly, in the temperature regulation device according to the invention, in which the dielectric fluid is intended to be sprayed onto an electronic component in order to regulate its temperature when it heats up during operation, it is desirable to have a dielectric fluid that is as cold as possible when it is sprayed and the thermal contact between the circuits makes it possible to cool the dielectric fluid by exchange of calories between this fluid and the heat transfer fluid present in the first circuit. Thus, there is a sub-cooling step, or additional cooling, to lower the temperature of the dielectric fluid before it leaves the second circuit to be sprayed onto the electronic component the temperature of which must be regulated.

The thermal regulation device advantageously comprises at least any one of the following technical features, taken individually or in combination:

- the thermal regulation device comprises at least one plate incorporating at least one first circuit so as to form a condenser capable of liquefying the fluid distributed by the at least one outlet of the second circuit. A circuit incorporated in a plate means that this circuit is formed in the thickness of the plate, whether via a configuration with channels hollowed out of the material or a configuration with shells applied against each other to form a wall of the condenser, with at least one of the shells being stamped to form a channel of said circuit.
- the condenser plate is provided on one of these faces with a heat transfer fluid inlet and a heat transfer fluid outlet between which the first circuit, in other words the heat transfer fluid circuit, extends.
- the second circuit is incorporated in the at least one condenser plate.
- the second circuit is incorporated in a plate identical to the plate incorporating the first circuit.
- the second circuit extends within the condenser plate such that it is surrounded by branches forming part of the first circuit.

the second circuit is formed in a peripheral zone of the at least one condenser plate, such as to leave clear a central zone of this plate for the heat transfer fluid circuit. Thus, the condenser can perform its primary function of liquefying the dielectric fluid which is vaporized after it has been sprayed onto the electronic components, which vaporized fluid may be present over the whole surface of the condenser main wall, which is configured to overlie the electronic component, without this functional condensation surface being disrupted by the passage of a dielectric fluid at a temperature different from that of the heat transfer fluid.

the first circuit and the second circuit are arranged on either side of the condenser plate, which comprises on a first face a plurality of cavities and on an opposite face a plurality of hollows, said cavities and hollows being covered by at least one cover and at least one cap, respectively, so that the cavities, respectively the hollows, form the first circuit, respectively the second circuit.

the second circuit is incorporated in a plate secant to the plate incorporating the first circuit.

the same side of the condenser plate is equipped with the dielectric fluid inlet, the heat transfer fluid inlet and the heat transfer fluid outlet, in order to facilitate a connection with means for supplying the main wall with heat transfer fluid and dielectric fluid.

at least the condenser plate is formed of two separate shells placed against one another, at least one shell comprising a boss which defines a cavity forming part of the heat transfer fluid circuit or part of the dielectric fluid circuit.

the condenser comprises at least one main wall provided with the dielectric fluid inlet as well as a heat transfer fluid inlet and a heat transfer fluid outlet, between which the heat transfer fluid circuit extends, the condenser further comprising a plurality of secondary walls projecting from the main wall, including a first lateral secondary wall provided at a first longitudinal end of the main wall, a second lateral secondary wall provided at a second longitudinal end of the main wall and an intermediate secondary wall that is interposed between the lateral secondary walls, the intermediate secondary wall helping to define, with part of the main wall and one of the lateral secondary walls, two chambers for receiving an electronic component.

the first circuit is formed at least in the main wall.

the second circuit is formed in at least one secondary wall.

the dielectric fluid circuit comprises a plurality of branches in parallel on each of the secondary walls.

each distribution outlet of the dielectric fluid circuit has a spray nozzle, each spray nozzle being oriented toward one of the electronic components.

spray nozzles are placed on each of the opposite faces of the condenser plate.

the second circuit is formed by a conduit produced separately from the at least one condenser plate and attached to a face of this plate which faces a chamber for receiving at least one electronic component. Producing the dielectric fluid circuit separately makes it possible to make the condenser and the heat transfer fluid circuit from different materials and/or with different thicknesses. This can in particular make it possible to manage differently the pressure resistance of the dielectric fluid circuit and the risk of leakage in the condenser. In particular, the dielectric fluid circuit may consist of an aluminum tube attached to the condenser.

if the second circuit is produced as a conduit separate from the condenser plate, this second circuit is secured to the condenser so as to form an integral assembly which can be mounted in one piece in the system of electronic components.

the conduit forming the second circuit has a dielectric fluid inlet end which is rigidly secured to the condenser plate, in particular by brazing.

the conduit forming the second circuit is secured to the condenser plate by means of securing studs.

the securing studs have a main dimension, defining the gap between the first circuit and the second circuit, less than 10 mm.

the conduit forming the second circuit has a substantially flat shape, and is arranged in a plane parallel to the condenser plate.

the conduit forming the second circuit has bent portions extending in a plane substantially perpendicular to the plane of the condenser plate.

the main and secondary walls are formed from three U-shaped shells, with a first shell straddling both a second shell and a third shell placed side by side, the heat transfer fluid circuit and the dielectric fluid circuit being provided between deformations created respectively on one or the other of the shells.

the first circuit and the second circuit are respectively formed by a conduit arranged in the vicinity of the corresponding electronic component.

each battery element comprises at least one electrical storage cell, the one or more electrical storage cell(s) being directly opposite the walls of the condenser. In this way, the spray of dielectric fluid is guided directly onto the storage cells, and cooling by means of the dielectric fluid can be more efficient, at least for the storage cells that receive the dielectric fluid directly.

each battery element comprises a second housing accommodating at least one electrical storage cell, the second housing extending between the one or more storage cell(s) and the walls of the condenser. In this way, the spray of dielectric fluid is guided directly onto the second housing, and cooling of the storage cells by means of the dielectric fluid can be more homogeneous for all the storage cells.

The invention also relates to a thermal regulation assembly comprising a thermal regulation device as described above and configured to regulate the temperature of a plurality of electronic components stacked in a stacking direction, at least one of the electronic components being associated with the at least one first circuit and the at least one second circuit, characterized in that said regulation device comprises a recovery tray for the dielectric fluid, arranged in the extension of the electronic components in the stacking direction and configured to receive the dielectric fluid coming from each condenser, the thermal regulation device comprising recirculation means for recirculating the dielectric fluid which are provided with a pump and which connect the recovery tray to at least one dielectric fluid inlet that each of the second circuits comprises.

The electronic components may be arranged in a tiered stack, forming a plurality of tiers of electronic components, and each tier may include one or more electronic components capable of giving off heat and therefore having to be cooled. Thus, the thermal regulation assembly may comprise a plurality of electronic components distributed in a plurality of columns of electronic components and a plurality of tiers, each tier of electronic components being provided with at least one first heat transfer fluid circuit and at least one second dielectric fluid circuit. In this case, the assembly is configured such that a recovery tray can receive the dielectric fluid which is sprayed onto each of the tiers of a given series of electronic components, and such that a pump can supply the series of dielectric fluid circuits with dielectric fluid coming from the recovery tray, thus permitting spraying of the given series of electronic components.

Figure 2:
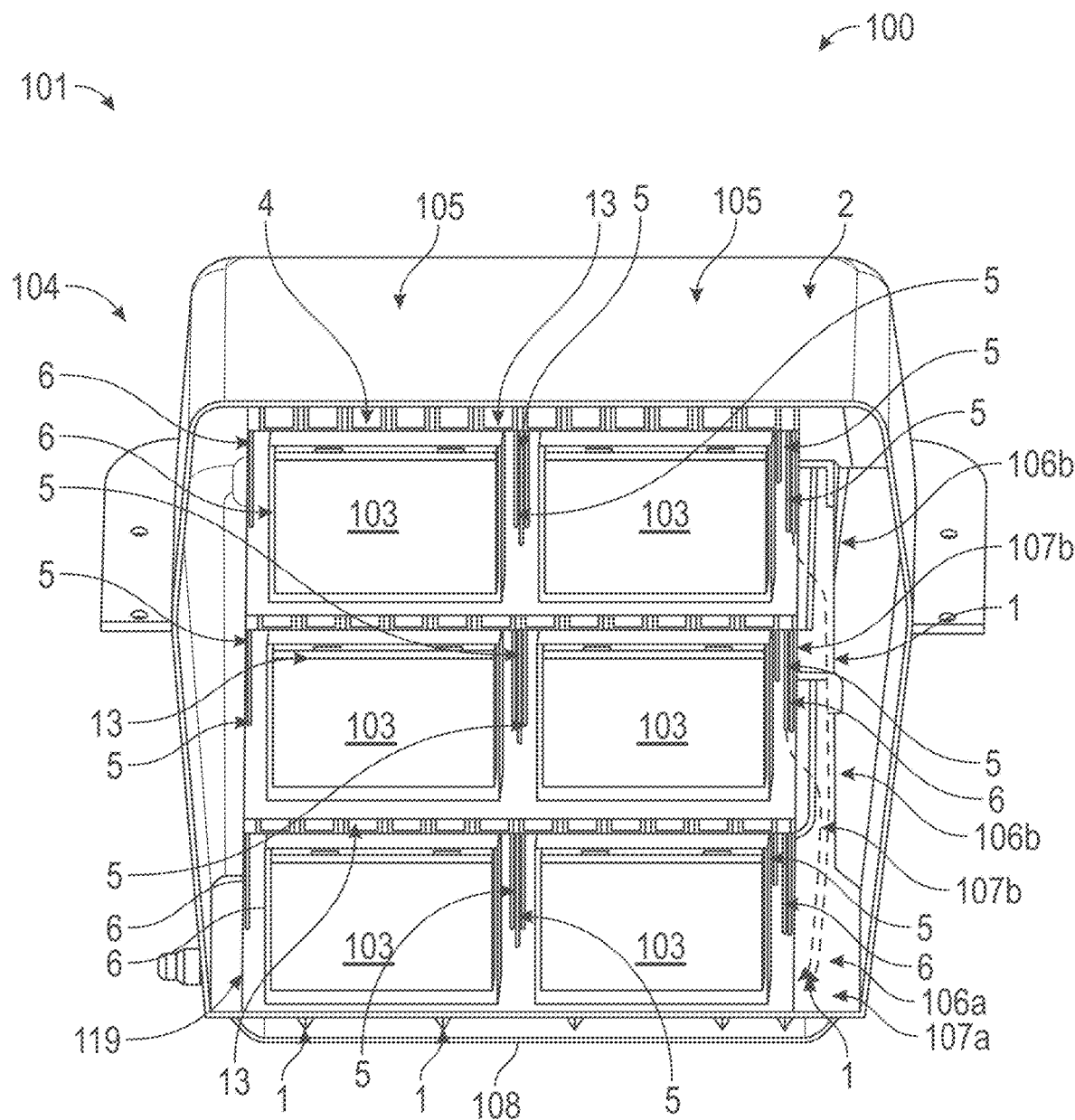
Figure 3:
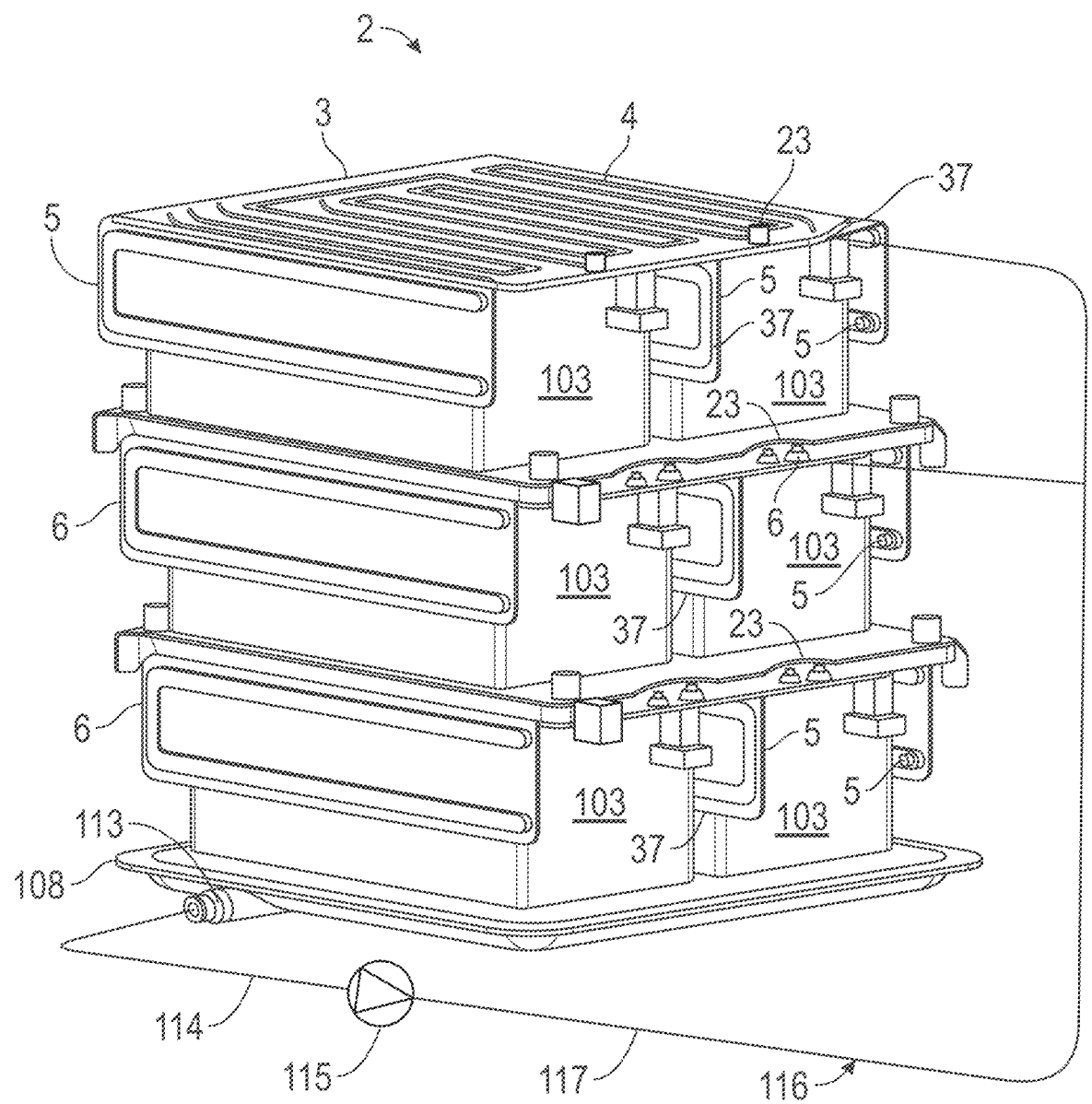
Figure 4:
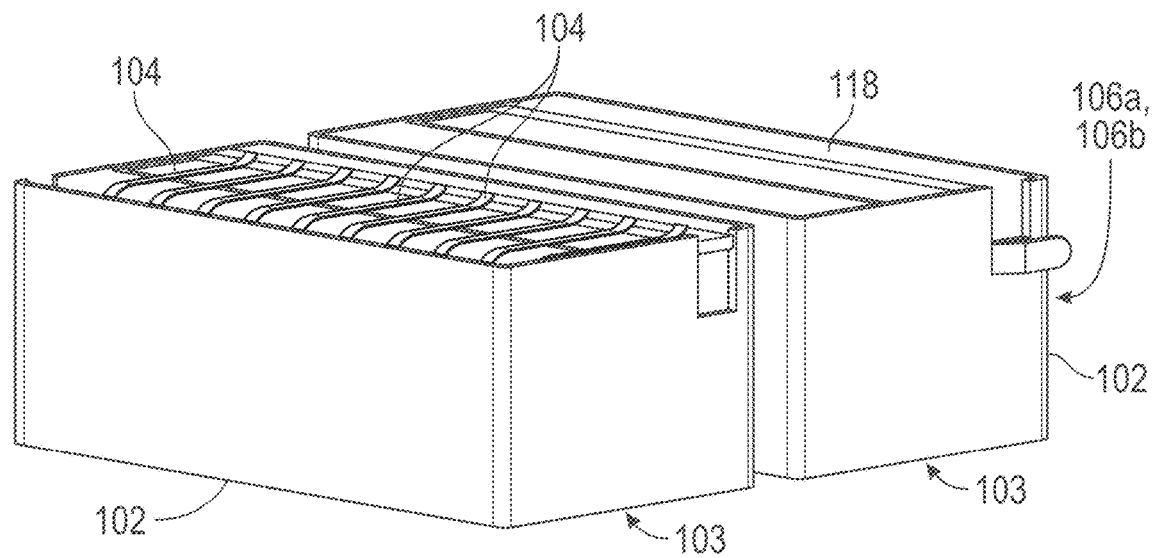
Figure 5:
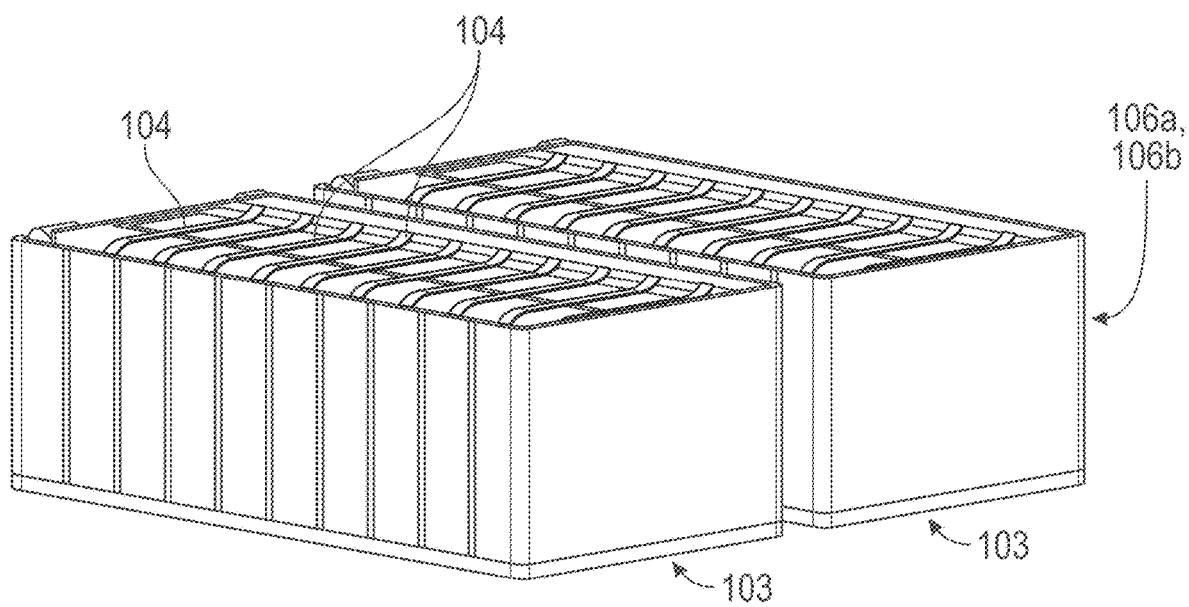
Figure 6:
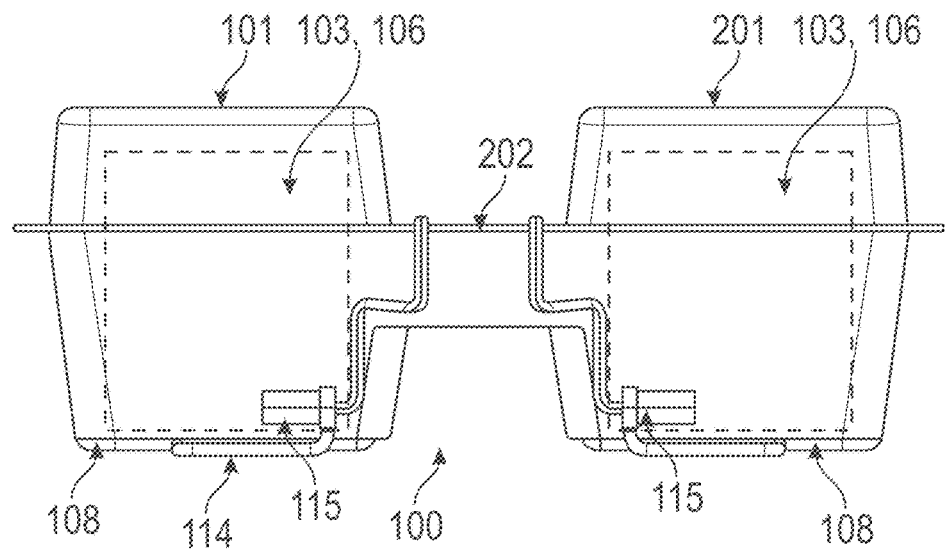
Figure 7:
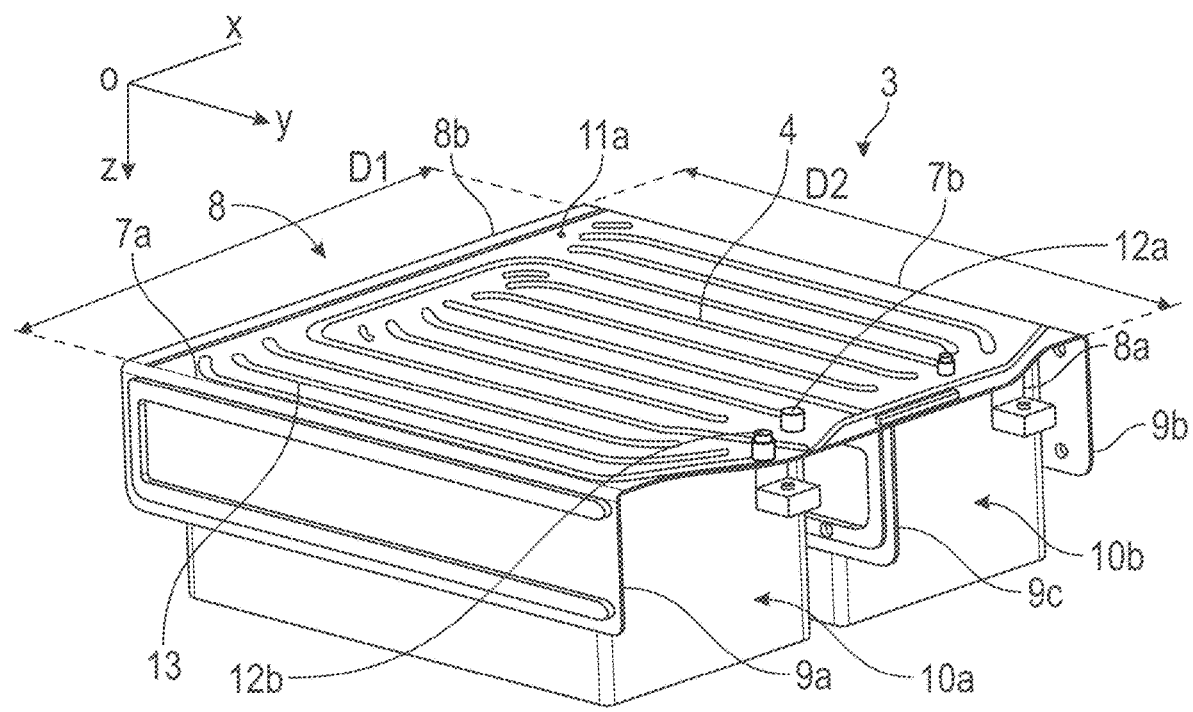
Figure 8:
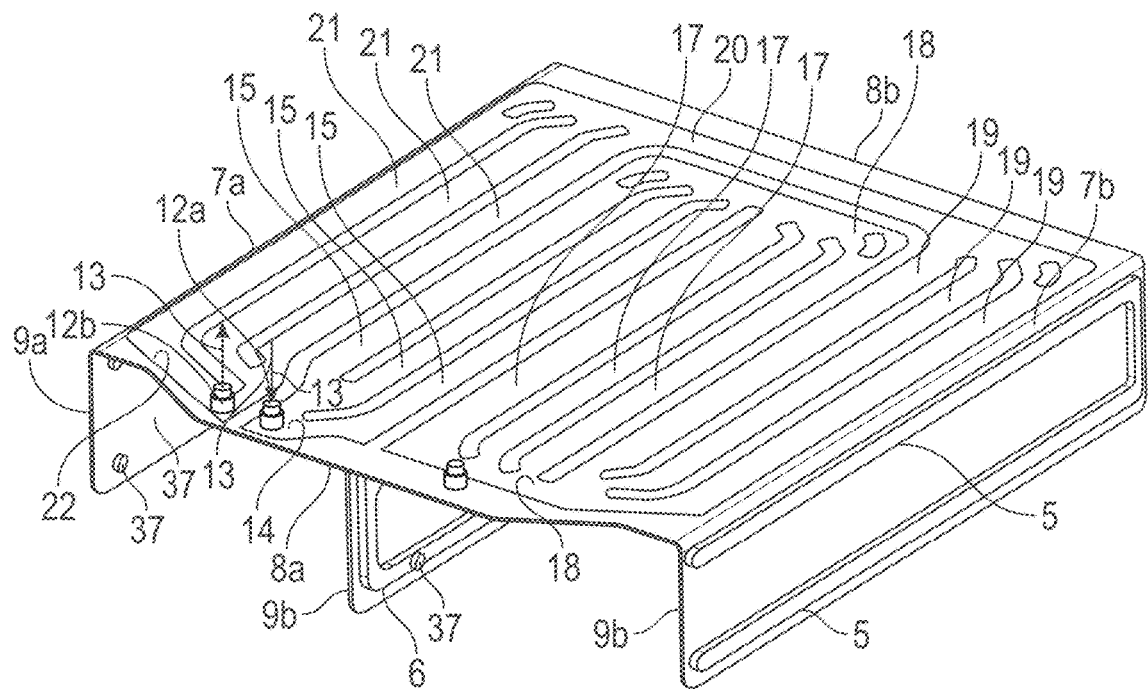
Figure 9:
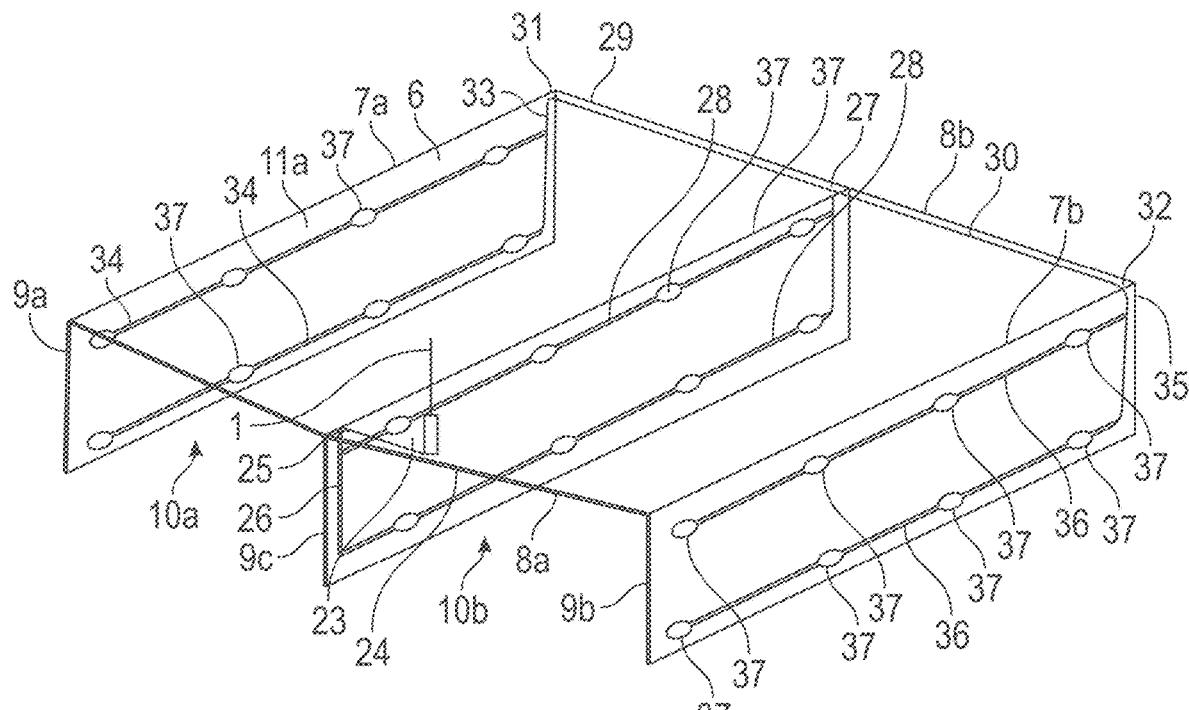
Figure 10:
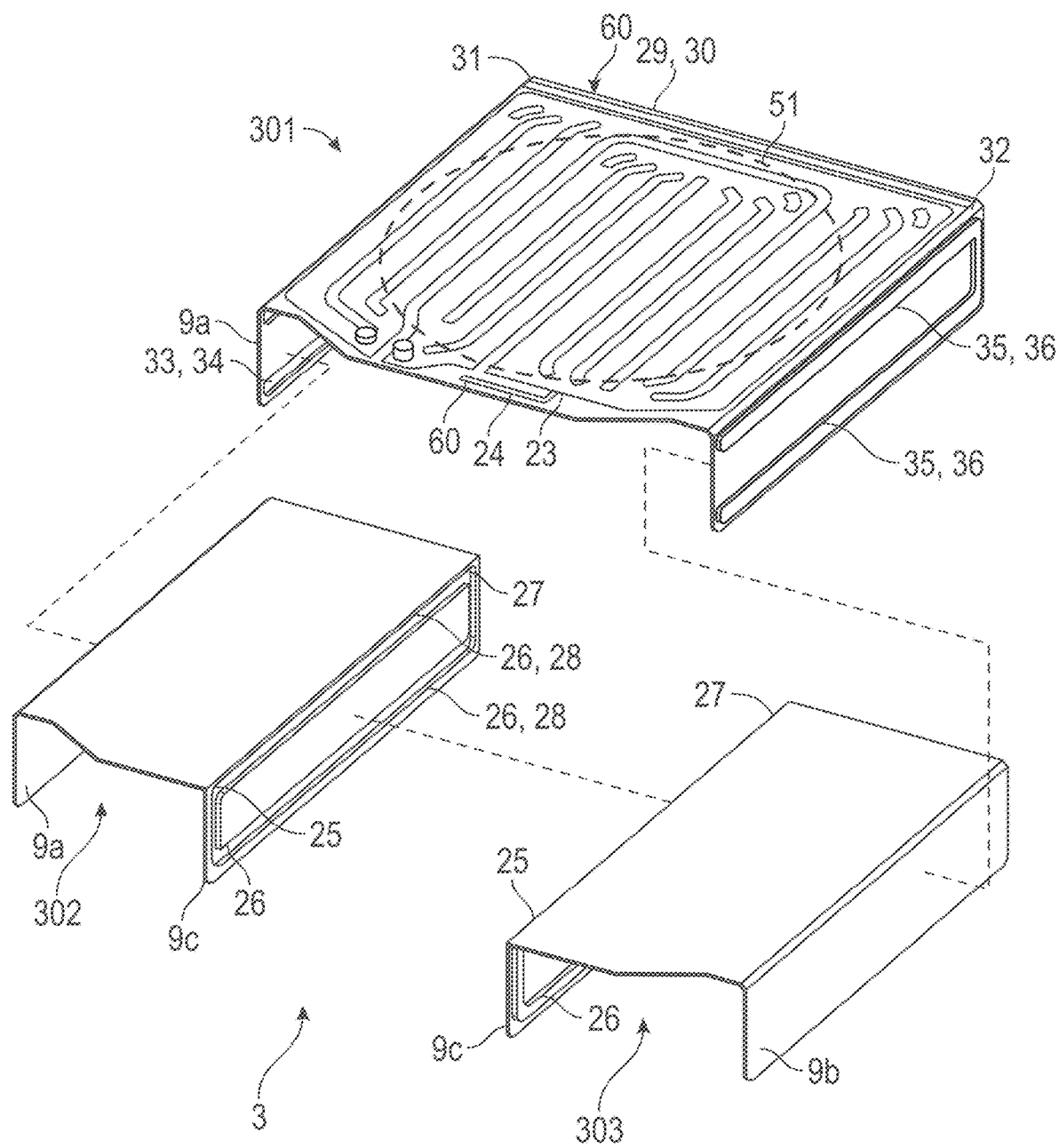
Figure 11:
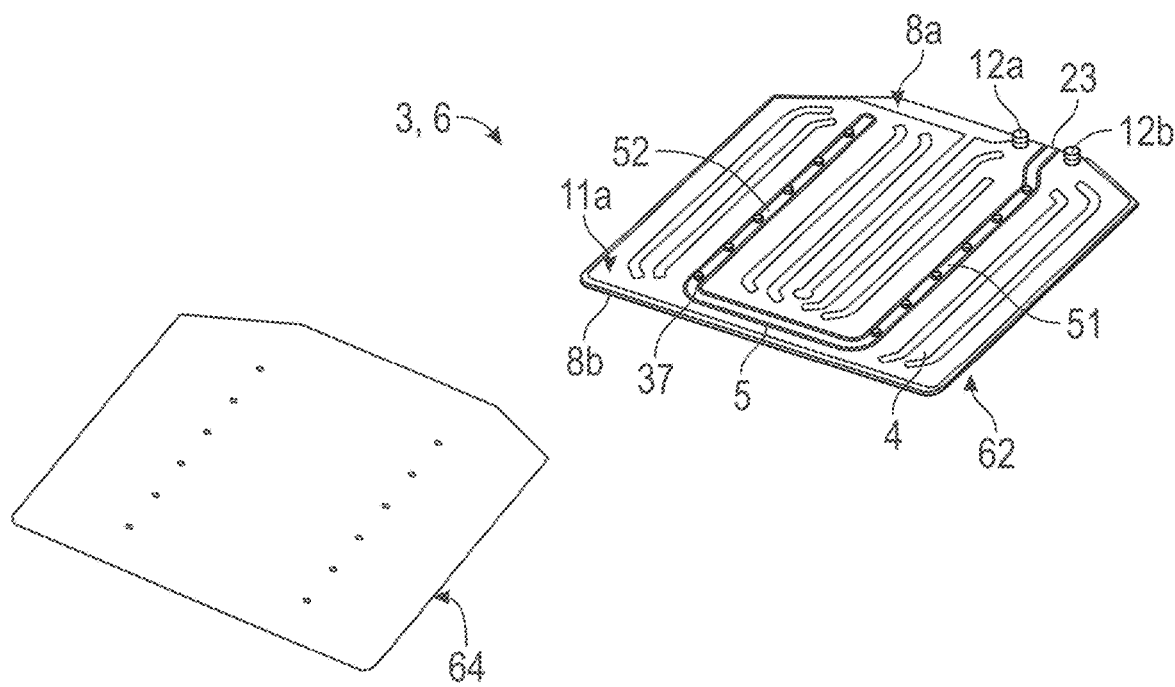
Figure 12:
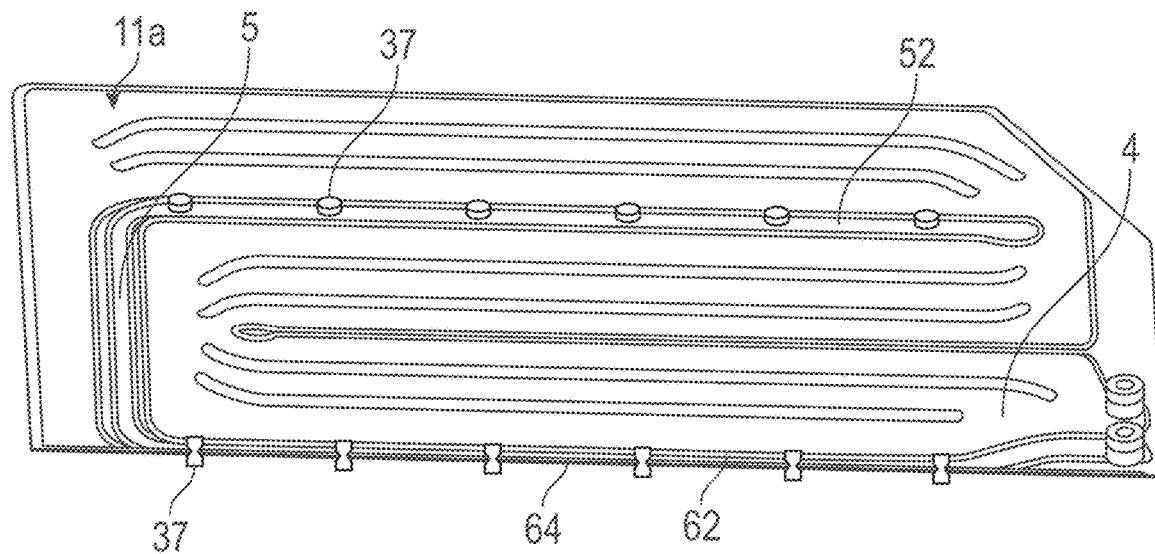
Figure 13:
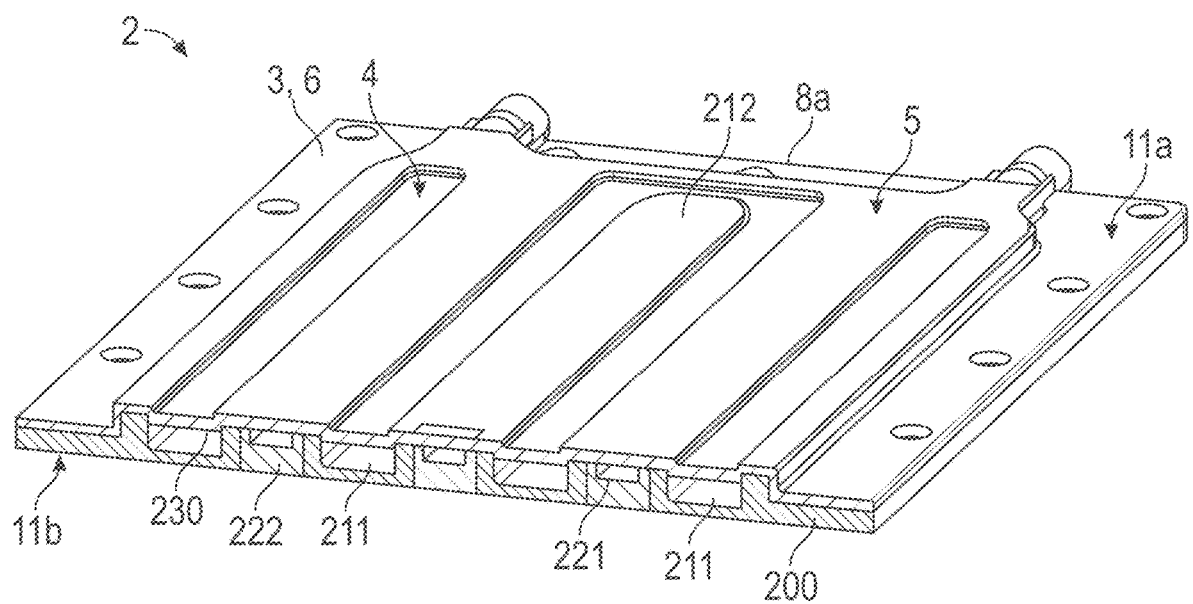
Figure 14:
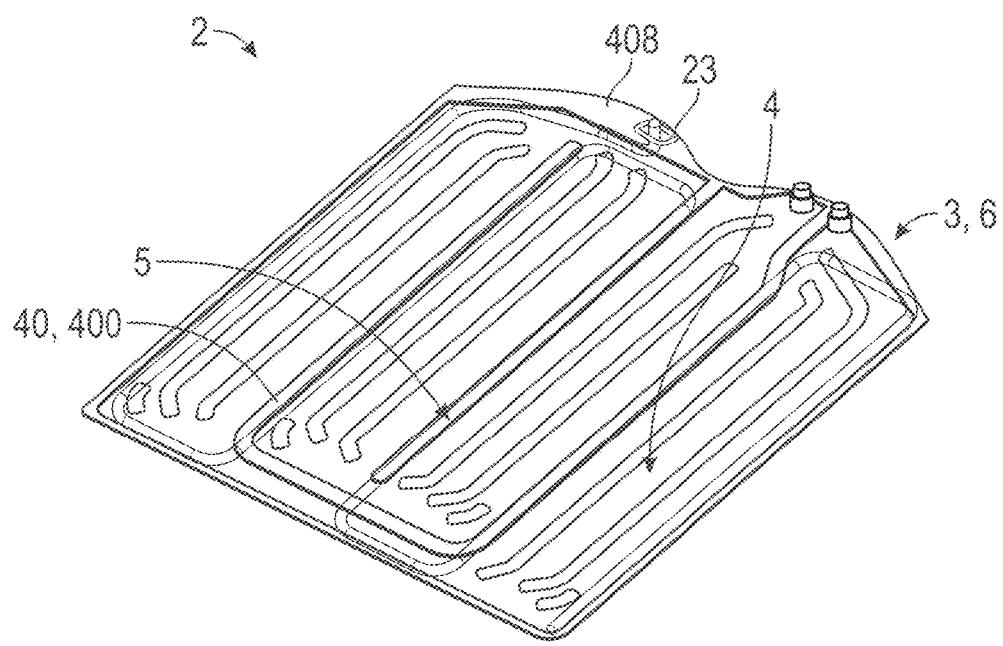
Figure 15:
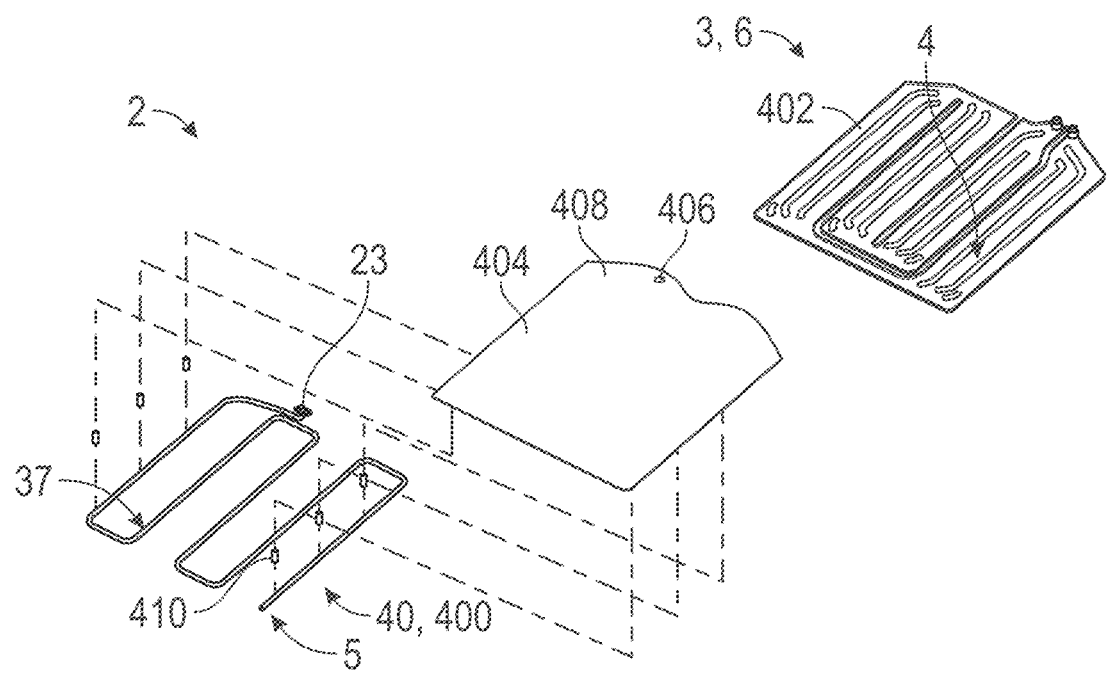
Figure 16:
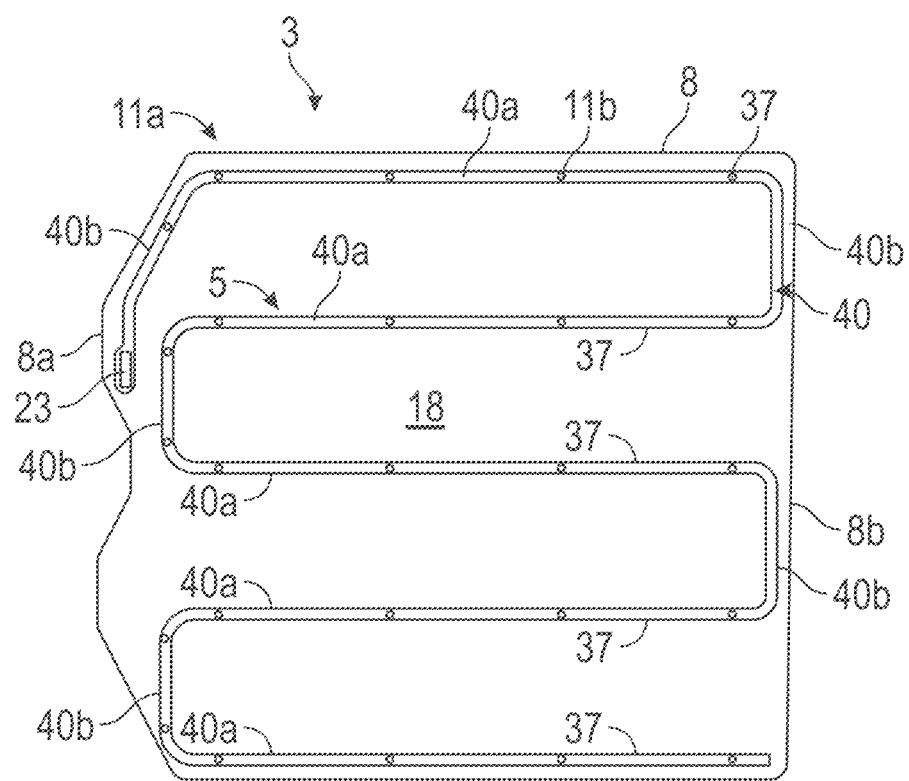
Figure 17:
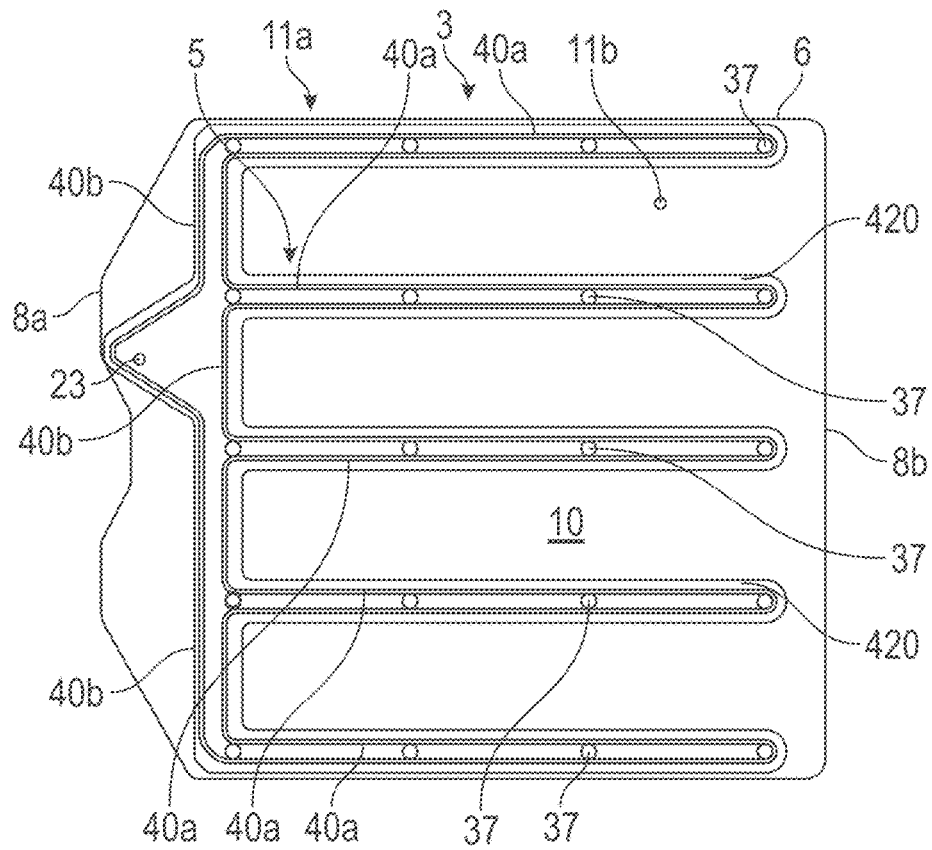
Figure 18:
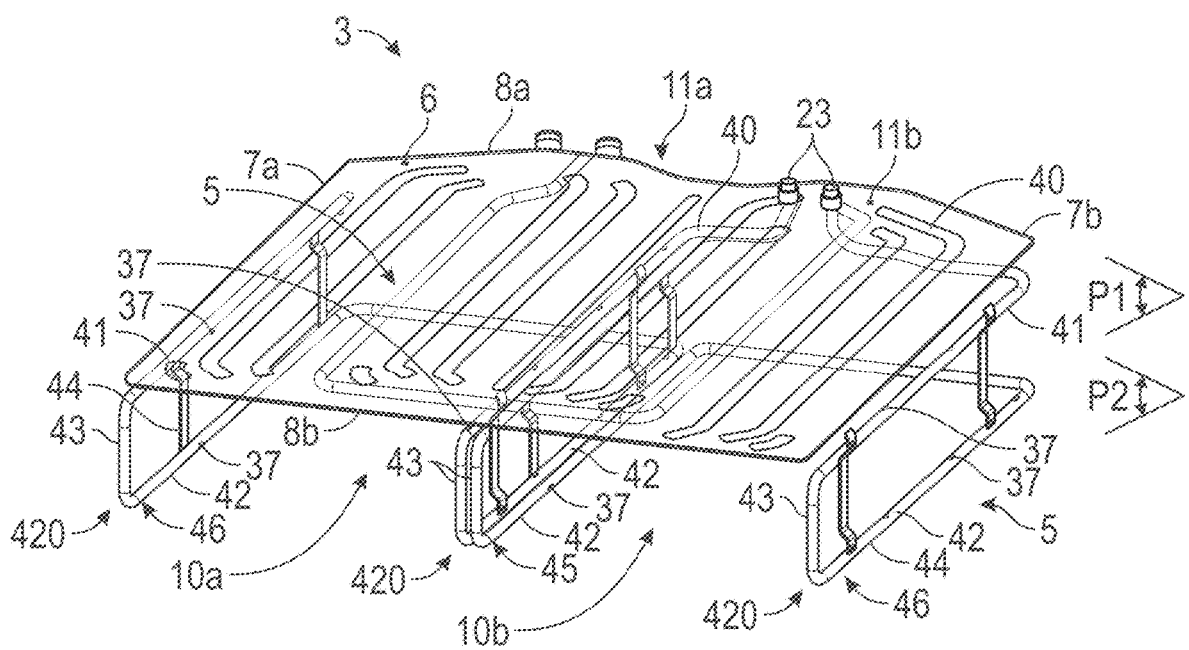
Figure 19:
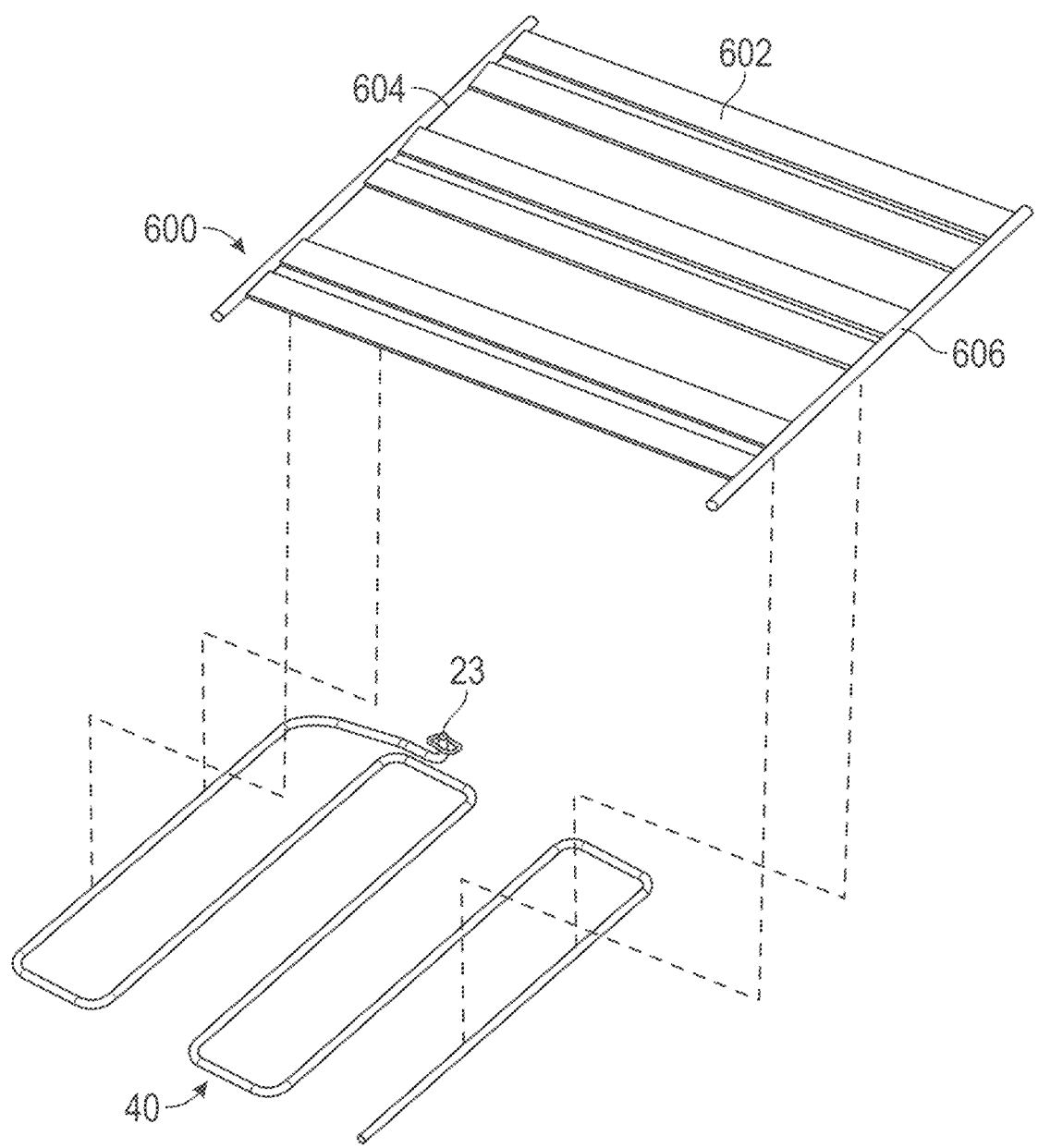

Further features and advantages of the invention will become more clearly apparent from the following description, on the one hand, and from several embodiments, which are provided for information and non-limiting purposes with reference to the accompanying schematic drawings, on the other hand, in which drawings:

FIG. 1 shows a perspective view of a section through a system of electronic components equipped with an assembly for thermal regulation of electronic components according to the present invention, FIG. 2 shows a front view of the section through the system shown in FIG. 1, FIG. 3 shows a partial perspective view of the system shown in FIGS. 1 and 2, specifically with a first housing removed in order to clearly show the thermal regulation assembly and to schematically show a recirculation duct and a pump of this thermal regulation assembly, FIG. 4 shows a perspective view of a first alternative of electronic components that can be cooled by the thermal regulation assembly shown in FIGS. 1 to 3, FIG. 5 shows a perspective view of a second alternative of electronic components that can be cooled by the thermal regulation assembly shown in FIGS. 1 to 3, FIG. 6 shows another embodiment of an electronic component housing comprising two thermal regulation assemblies according to the present invention, FIG. 7 shows a perspective view of a thermal regulation device according to a first embodiment, as provided in the system shown in FIGS. 1 to 3, intended to cool the electronic components shown in FIG. 4 or 5, FIG. 8 shows a perspective view of the thermal regulation device shown in FIG. 7, FIG. 9 shows a schematic view of the thermal regulation device shown in FIGS. 7 and 8, in order to clearly show the dielectric fluid circulation channels present in the thickness of a condenser plate of this thermal regulation device, FIG. 10 shows an exploded perspective view of the thermal regulation device shown in FIGS. 7 to 9, FIG. 11 shows a thermal regulation device according to a second embodiment, in an exploded view, with a heat transfer fluid circuit and a dielectric fluid circuit formed in the thickness of the same condenser plate, FIG. 12 shows a sectional view of the thermal regulation device of FIG. 11, clearly showing in particular the dielectric fluid outlets arranged on either side of the condenser plate, FIG. 13 shows a thermal regulation device according to a third embodiment, in section, with the heat transfer fluid and dielectric fluid circuits which are arranged on either side of the same plate helping to form a condenser, FIG. 14 shows a thermal regulation device according to a fourth embodiment, with a dielectric fluid circuit produced separately as a conduit attached on, or in the immediate vicinity of, the condenser plate, FIG. 15 shows an exploded view of the thermal regulation device of FIG. 14, FIG. 16 shows a view from below of the thermal regulation device of FIG. 14, FIG. 17 shows an alternative of the thermal regulation device of FIG. 14, FIG. 18 shows a thermal regulation device according to a fifth embodiment, differing from the fourth embodiment by the shape of the conduit forming the dielectric fluid circuit, FIG. 19 is an exploded view of a thermal regulation device according to a sixth embodiment, differing from the fourth embodiment by the shape of the heat transfer fluid conduit, FIG. 20 shows various possible arrangements of a thermal regulation assembly according to the invention comprising a thermal regulation device and electronic components to be cooled.

The features, the alternatives and the various embodiments of the invention can be combined with one another, in various combinations, provided that they are not mutually incompatible or exclusive. In particular, alternative embodiments of the invention can be contemplated that only comprise a selection of features that are described hereafter independently of the other described features, if this selection of features is sufficient to provide a technical advantage or to differentiate the invention from the prior art.

In particular, all the alternatives and all the embodiments described can be combined together if there are no technical obstacles to this combination.

In the figures, elements common to several figures keep the same reference sign.

In FIG. 1, a system of electronic components 100, suitable in particular for being fitted to an electric or hybrid motor vehicle, is shown. Such a system 100 is intended to supply electrical energy to an electric motor fitted to the motor vehicle for the purpose of moving the vehicle.

According to the invention, the system of electronic components is equipped with a thermal regulation device 2 which comprises at least one first circuit 4 configured to allow the circulation of a heat transfer fluid and at least one second circuit 5 configured to convey a dielectric fluid, this second circuit comprising at least one outlet for distributing the dielectric fluid in the direction of an electronic component, the temperature of which must be regulated in particular because it heats up during operation. The dielectric fluid captures calories given off by the electronic component, where appropriate vaporizing under the effect of the temperature to be regulated, and the heat transfer fluid present in the first circuit has the main role of recovering calories from the dielectric fluid by convection. Thus, the first circuit is in thermal interaction with the dielectric fluid distributed by the at least one outlet of the second circuit, to cool the latter, if necessary to restore it to a liquid state, so that it can be reinjected into the second circuit and sprayed again onto the electronic component.

Furthermore, the thermal regulation device is configured such that the first and second circuits are in thermal contact, that is to say with a mechanical proximity such that calories can be exchanged from one circuit to the other, and more particularly from a fluid present in one circuit to another fluid present in the other circuit. Such an arrangement allows, where appropriate, sub-cooling of the dielectric fluid before it is sprayed onto the electronic components, or in other words preliminary cooling of the dielectric fluid while it is circulating in the liquid phase in the second circuit, and therefore greater efficiency in the desired thermal regulation.

In the example shown, the system of electronic components 100 comprises a first housing 101 which houses a plurality of electronic components, in this case taking the form of electronic components 103, it being understood that other configurations of the system of electronic components could be implemented according to the invention when this system comprises a thermal regulation device in accordance with the teachings of the invention.

The first housing 101 comprises two half-shells 109a, 109b, including a first shell 109a and a second shell 109b, which are arranged as a cup and which are joined together by means of their rims 110. To this end, each rim 110 is provided with a lip 111, the lip 111 of the first shell 109a being secured to the lip 111 of the second shell 109b by means of reversible joining means 112, such as screws or the like.

The electronic components 103 are shaped as a parallelepiped and are arranged relative to each other by being disposed as a tiered stack. More specifically, the electronic components 103 are stacked on top of each other in a plurality of columns 105 while being distributed over several tiers 106a, 106b. In other words, each tier 106a, 106b of electronic components 103 preferably comprises a plurality of electronic components 103 as a function of the number of columns 105, it being understood that the number of tiers and of columns of electronic components varies as a function of the permitted spatial requirement of the first housing and as a function of the amount of electrical energy to be stored. In the same tier 106a, 106b of electronic components 103, said electronic components are disposed side-by-side and each tier 106a, 106b of electronic components 103 is supported by a shelf 107a, 107b, on which the electronic components 103 rest.

According to the example shown, there are six electronic components 103 and they are distributed over two columns 105 and three tiers 106a, 106b, each column 105 comprising three electronic components 103 and each tier 106a, 106b comprising two electronic components 103. As stated above, the number of columns 105 and the number of tiers 106a, 106b may be different from the example shown, in particular higher.

As they operate, the electronic components 103 tend to heat up. Thus, the motor vehicle is equipped with a thermal regulation device 2 for thermally regulating the electronic components 103, as described above. Advantageously, the thermal regulation device 2 of the present invention is capable of simultaneously cooling each of the tiers 106a, 106b of electronic components 103.

In the example shown in FIG. 1, the thermal regulation device 2 associates at least one condenser 3 housing a first circuit 4, more particularly a heat transfer fluid circuit, with a second circuit, more particularly a dielectric fluid circuit. 5, which is arranged to spray a dielectric fluid 1 onto a corresponding tier 106a, 106b of electronic components 103. The heat transfer fluid circuit 4 is in particular intended to change from a vapor state to a liquid state the dielectric fluid 1 sprayed onto the electronic components 103 and converted to vapor under the effect of the heat given off by the electronic components.

The first heat transfer fluid circuit is thus in thermal interaction with the dielectric fluid once the latter has been sprayed from the second circuit and vaporized by the heat given off by the electronic components, in the sense that the heat transfer fluid and the corresponding first circuit are configured to exchange calories with the vaporized dielectric fluid, and in particular to transfer frigories to this dielectric fluid so that it returns to the liquid state.

In particular, the heat transfer fluid may consist of a coolant or a coolant fluid, and for example may consist of glycolated water, R134a or 1234yf, or of $CO_2$, without this list being limiting.

With respect to the dielectric fluid, this is selected as a function of its phase transition point. By way of an example, the fluid selected in this case must have an evaporation temperature at atmospheric pressure that is higher than 32, 33 or 34 degrees Celsius and a condensation temperature that is lower than 31, 30 or 29 degrees Celsius.

In other words, the dielectric fluid sprayed in liquid form onto the electronic components of a given tier recovers calories released by these electronic components and is thus converted into vapor. The vapor rises and comes into contact with the condenser 3, inside which a heat transfer fluid circulates, and the condenser recovers the calories previously stored by the dielectric fluid until the latter is liquefied, by thermal interaction between the first heat transfer fluid circuit and the dielectric fluid then in the gas phase. Once in liquid form, and as droplets, the dielectric fluid falls into the first housing under the effect of gravity.

In this first embodiment, the thermal regulation device of the present invention comprises at least as many dielectric fluid circuits 5 as the first housing 101 accommodates tiers 106a, 106b of electronic components 103, and it advantageously comprises as many condensers 3 as the first housing 101 accommodates tiers 106a, 106b of electronic components 103. Moreover, each dielectric fluid circuit 5 is advantageously associated with a corresponding condenser 3 in order to optimize condensation of the dielectric fluid 1 and, subsequently, cooling of the electronic components 103, tier by tier, with such an association being as compact as possible inside the first housing 101 which defines a confined space that is desired to be as small as possible.

As is more specifically shown in FIG. 2, the first housing 101 comprises a base constituting a recovery tray 108 for the dielectric fluid 1 that flows under the effect of gravity from one tier 106a, 106b of electronic components 103 to a lower tier 106a, 106b of electronic components 103. More specifically, the recovery tray is used to recover dielectric fluid that has been vaporized by each condenser. To this end, each of the shelves supporting the tiers of electronic components is configured to allow fluid to move under the effect of gravity toward the recovery tray.

Among the shelves 107a, 107b on which a respective tier 106a, 106b of electronic components 103 rests, there is a lower shelf 107a on which a lower tier 106a of electronic components 103 rests. It is understood that the lower tier 106a is that of the tiers 106a, 106b that does not overlie any other tier and is thus the lowest of the tiers 106a, 106b of the tiered stack of electronic components 103 described above, with reference to a vertical arrangement and to the gravity flow direction of the dielectric fluid in liquid form. It is also understood that the upper tiers 106b of electronic components 103 supported by a corresponding upper shelf 107b overlie at least one other tier 106a, 106b of electronic components 103.

Having made this distinction, it should be noted that the lower shelf 107a is perforated with a plurality of orifices 119 allowing the dielectric fluid to flow through it toward the recovery tray. The orifices 119 are designed to allow an operation that involves filtering the dielectric fluid before it enters the recovery tray. In order to enable an efficient filtering operation, the lower shelf 107a is designed to be in contact, over its perimeter, with the walls defining the first housing.

It also should be noted that the upper shelves 107b have a solid, non-perforated surface, and that they are designed to form a peripheral passage between the perimeters of the corresponding shelf and the walls defining the first housing. It is understood that these upper shelves 107b overlie a lower tier and thus a condenser and that in this embodiment it is not desired for the dielectric fluid in liquid form to flow over the upper face of the condenser, i.e. over the face opposite the upper shelf. Therefore, note that according to the invention, and as illustrated by dashed lines in FIG. 2, the dielectric fluid in liquid form is discharged via the sides of the shelf in the upper tiers by falling onto the lower shelf, the dielectric fluid being able to pass into the recovery tray via the orifices 119 when this fluid stagnates on the lower shelf 107a.

According to an alternative that has not been shown, each, or at least some, of the upper shelves may also be perforated, provided that the condenser which these perforated shelves overlie is arranged such as to have a plane which is inclined relative to the plane of the corresponding shelf. Therefore, the water flowing through the upper shelves via the perforations cannot stagnate between the condenser and the corresponding upper shelf and can flow over the sides in order to fall into the recovery tray under the effect of gravity.

With reference to FIG. 3, the recovery tray 108 is provided with a discharge pipe 113 for the dielectric fluid 1 recovered inside the recovery tray 108, the discharge pipe 113 being in fluid communication with a recirculation duct 114 for the dielectric fluid 1. The recirculation duct 114 is equipped with a pump 115 for conveying the dielectric fluid 1 to each of the dielectric fluid inlets 23 equipping a condenser. Thus, the pump 115, which is common to each of the tiers of electronic components of the thermal regulation device 2, is capable of supplying dielectric fluid 1 to all the dielectric fluid circuits 5 that the thermal regulation device 2 comprises, which is advantageous in terms of the production cost. It is understood that a distributor, not shown in the figure, is capable of supplying dielectric fluid 1 to all the dielectric fluid circuits 5 that the thermal regulation device 2 comprises and that equip a respective tier 106a, 106b of electronic components 103.

As shown, note that the dielectric fluid inlets 23 are all arranged on the same side of each condenser 3, in order to facilitate the distribution of the dielectric fluid recovered in the common recovery tray to each of the dielectric fluid inlets.

Each dielectric fluid circuit 5 is provided with at least one spray nozzle 37, which is capable of spraying the dielectric fluid 1 in the liquid state toward the electronic components 103 in order to cool them. It is thus understood that the dielectric fluid 1 passes through a circulation loop 116 comprising the recovery tray 108 for recovering the dielectric fluid 1 in the liquid state, the recirculation duct 114 for recirculating the dielectric fluid 1 equipped with the pump 115 supplies, via recirculation means 117, jointly each dielectric fluid circuit 5 equipping a tier 106a, 106b of electronic components 103, the spray nozzles 37 of the dielectric fluid circuits 5 spraying the electronic components 103 with dielectric fluid 1 which vaporizes on contact with them and then liquefies in contact with the condensers 3 before dripping into a common recovery tray 108 under the effect of gravity.

In FIGS. 4 and 5, the electronic components may be battery cells, for example. FIG. 4 shows a tier 106a, 106b of battery elements 103 according to a first alternative embodiment. Each battery element 103 comprises a second housing 102 that accommodates a plurality of electrical storage cells 104. The second housing 102 comprises a cover 118, which is removed from one of the second housings 102 in order to reveal the electrical storage cells 104. In this first alternative embodiment, the dielectric fluid sprayed via the nozzles equipping the dielectric fluid circuit comes into contact with the second housing and vaporizes under the effect of the heat released by this second housing. The cooling of this second housing causes a temperature drop in the enclosure in which the electrical storage cells are housed, and therefore causes a temperature drop in the cells themselves.

FIG. 5 shows a tier 106a, 106b of battery elements 103 according to a second alternative embodiment. Each battery element 103 only comprises a plurality of electrical storage cells 104. In this second alternative embodiment, in which the electrical storage cells are directly opposite the condenser, the dielectric fluid sprayed via the nozzles equipping the dielectric fluid circuit comes into direct contact with the electrical storage cells and vaporizes under the effect of the heat released by each of these cells.

It is understood that each electrical storage cell 104 is the functional unit of the battery element 103 that at least partially supplies the electric motor with the electrical energy that it requires. The electrical storage cell 104 is a lithium-ion cell or similar, for example.

FIG. 6 shows an embodiment of a housing for electronic components in which two cooling devices are provided. In accordance with the above description, each thermal regulation device is associated with a portion of the system of electronic components 100 comprising a housing 101, 201 that accommodates a plurality of electronic components 103 arranged in tiers 106, and each thermal regulation device comprises a recovery tray arranged at the bottom of the corresponding housing in order to recover the dielectric fluid originally sprayed onto a plurality of tiers of electronic components.

In the example shown, a first housing 101 and a second housing 201 are arranged side-by-side with a connection portion 202 that has a clearance zone in order to conform to a particular arrangement of a motor vehicle, with this by no means being limiting. The example of FIG. 6 is particularly advantageous in that it explains that a housing for electronic components may comprise a plurality of recovery trays and a plurality of pumps, in which each recovery tray and each associated pump are arranged to recover the dielectric fluid sprayed onto a plurality of electronic components stacked on top of each other and above the recovery tray in question.

Various embodiments of a thermal regulation device according to the invention will now be described with reference to FIGS. 7 to 19. It should be noted that in these figures the thermal regulation device is shown in a configuration associated with a single tier of electronic components, but that it could be implemented, with several other similar devices in a system of electronic components with several tiers as described above.

FIGS. 7 to 10 show a first embodiment, in accordance with what has been shown in the preceding figures, and show more particularly clearly the feature of the invention whereby the heat transfer fluid and dielectric fluid circuits are in thermal contact with each other.

In FIG. 7, the condenser 3 is shown in an orthonormal reference system Oxyz comprising a longitudinal axis Ox, a lateral axis Oy, and a transverse axis Oz. The condenser 3 comprises a main wall 6 that extends in a plane parallel to the plane Oxy. The main wall 6 is substantially arranged as a quadrilateral that comprises two longitudinal ends of the main wall 7a, 7b, opposite each other and provided at a first distance D1 from each other, and two lateral ends of the main wall 8a, 8b, opposite each other and provided at a second distance D2 from each other.

The condenser 3 also comprises three secondary walls 9a, 9b, 9c that respectively extend in a plane parallel to the plane Oyz. The following can be distinguished from among the three secondary walls 9a, 9b, 9c: a first lateral secondary wall 9a that is provided at a first longitudinal end of the main wall 7a, a second lateral secondary wall 9b that is provided at a second longitudinal end of the main wall 7b and an intermediate secondary wall 9c that is interposed between the lateral secondary walls 9a, 9b, in this case being disposed at an equal distance from the first lateral secondary wall 9a and from the second lateral secondary wall 9b.

The first lateral secondary wall 9a and the intermediate secondary wall 9c define, with a portion of the main wall 6, a first chamber 10a that is intended to receive a first electronic component 103. The second lateral secondary wall 9b and the intermediate secondary wall 9c define, with another portion of the main wall 6, a second chamber 10b that is intended to receive a second electronic component 103.

The main wall 6 houses the heat transfer fluid circuit 4 coiled within the main wall 6, above the first chamber 10a and above the second chamber 10b. According to one embodiment, the heat transfer fluid circuit 4 is provided in a thickness of the main wall 6. According to another embodiment, the main wall 6 is formed by two shells placed against one another, at least one shell comprising a boss that defines a cavity forming the heat transfer fluid circuit 4. In this case, the heat transfer fluid circuit 4 is provided in relief on at least one of the shells.

The main wall 6 comprises a first face 11a, the upper face in FIG. 7, which is provided with a heat transfer fluid inlet 12a and a heat transfer fluid outlet 12b. The heat transfer fluid inlet 12a is provided to allow a heat transfer fluid 13 to enter the heat transfer fluid circuit 4, while the heat transfer fluid outlet 12b is provided to allow the heat transfer fluid 13 to discharge out of the heat transfer fluid circuit 4. The heat transfer fluid 13 is carbon dioxide or similar, for example. It is understood that from a flow of heat transfer fluid 13 inside the first circuit 4, the heat transfer fluid 13 cools the main wall 6 in order to keep it at a temperature that is below a condensation temperature of the dielectric fluid 1, which ensures, upon contact therewith, that the dielectric fluid 1 transitions to the liquid state.

As may have been mentioned above, the heat transfer fluid circuit is thus in thermal interaction with the dielectric fluid distributed at the outlet of the second circuit.

As is more clearly shown in FIG. 8, the heat transfer fluid inlet 12a and the heat transfer fluid outlet 12b are provided in the vicinity of a first lateral end of the main wall 8a and the heat transfer fluid circuit 4 extends from the heat transfer fluid inlet 12a to the heat transfer fluid outlet 12b. The heat transfer fluid circuit 4 comprises, for example, a plurality of heat transfer fluid circulation branches 15, 17, 19, 21 that are provided parallel to each other. Thus, according to the example shown, the heat transfer fluid inlet 12a is in fluid communication with a distributor 14 that supplies three first heat transfer fluid circulation branches 15 that are parallel to each other. These three first heat transfer fluid circulation branches 15 open into a first manifold 16 that is provided in the vicinity of a second lateral end of the main wall 8b. Furthermore, the heat transfer fluid 13 travels substantially the second distance D2, shown in FIG. 7, inside the first heat transfer fluid circulation branches 15. The first manifold 16 is in fluid communication with three second heat transfer fluid circulation branches 17 that are provided parallel to each other. The three second heat transfer fluid circulation branches 17 extend from the first manifold 16 to a second manifold 18 that is provided in the vicinity of the first lateral end of the main wall 8a. Furthermore, the heat transfer fluid 13 again travels substantially the second distance D2 inside the second heat transfer fluid circulation branches 17. The second manifold 18 is in fluid communication with three third heat transfer fluid circulation branches 19 that are provided parallel to each other, with one of the third heat transfer fluid circulation branches 19 bordering the second longitudinal end of the main wall 7b. The three third heat transfer fluid circulation branches 19 extend from the second manifold 18 to a third manifold 20 that is provided in the vicinity of the second lateral end of the main wall 8b and that extends along the second lateral end of the main wall 8b to the first longitudinal end of the main wall 7a. Furthermore, the heat transfer fluid 13 again travels substantially the second distance D2 inside the third heat transfer fluid circulation branches 19. Furthermore, the heat transfer fluid 13 travels substantially the first distance D1, shown in FIG. 7, inside the third manifold 20. The third manifold 20 is in fluid communication with three fourth heat transfer fluid circulation branches 21 that are provided parallel to each other, with one of the fourth heat transfer fluid circulation branches 21 bordering the first longitudinal end of the main wall 7a. The three fourth heat transfer fluid circulation branches 21 extend from the third manifold 20 to a fourth manifold 22 that is provided with the heat transfer fluid outlet 12b. It is understood that the number of heat transfer fluid circulation branches 15, 17, 19, 21 disposed between two manifolds 16, 18, 20 or between a manifold 16, 18, 20 and the distributor 14, as well as the number of manifolds 16, 18, 20, may be different from those stated above.

The fact that the heat transfer fluid 13 travels the second distance D2 and the first distance D1 several times allows the entire surface of the main wall 6 to be cooled and, subsequently, allows cooling of the dielectric fluid 1 that comes into contact with the main wall 6 after it is vaporized in contact with the electronic components 103.

Note that the main wall and the various heat transfer fluid circulation branches that are formed therein are configured so that the heat transfer fluid circuit 4 is arranged in a central zone 61 of the main wall 6.

Following the description of the heat transfer fluid circuit 4, the dielectric fluid circuit 5 will now be described. In this first embodiment, the dielectric fluid circuit 5 is produced in the thickness of the condenser, i.e. by being integrated in at least one of the walls 6, 9a, 9b, 9c forming the condenser 3.

The dielectric fluid circuit may in particular be described with reference to FIGS. 9 and 10, which schematically show this circuit in an exploded view.

In particular, the circuit may be produced by stamped portions that are respectively formed in either or both of two shells that each form walls once they are assembled together. In this context, and according to an embodiment which is shown more clearly in the exploded view in FIG. 10, the walls 6, 9a, 9b, 9c may be formed from three shells 301, 302, 303, which in particular are made of metal, and are U-shaped, a first shell 301 of which accommodates a second shell 302 and a third shell 303, with the heat transfer fluid circuit 4 and the dielectric fluid circuit 5 being provided between the shells 301, 302, 303, in particular by means of embossing of the shells. The shells 301, 302, 303 are brazed or welded together, for example. It is understood that, in this case, the second shell and the third shell are designed to each define a chamber for receiving an electrical component.

Moreover, and further to the aforementioned description of the position of the heat transfer fluid circuit in a central zone 61, the dielectric fluid circuit 5 is arranged in this case in the condenser so as to leave this central zone formed in the main wall clear, either by extending over walls of the condenser other than the main wall, and/or by extending over a peripheral zone 60 of the main wall.

In each of these cases, note that, as will be described in detail below, at least a portion of the second circuit 5 is in thermal contact with the first circuit 4, and that at least over a defined portion of this second circuit a sub-cooling step is implemented.

The first face 11a of the main wall 6 is provided with a dielectric fluid inlet 23 that is provided in the vicinity of the first lateral end of the main wall 8a. The dielectric fluid inlet 23 allows dielectric fluid 1 to enter the dielectric fluid circuit 5. The dielectric fluid inlet 23 is in fluid communication with a first dielectric fluid channel 24 that runs along the first lateral end of the main wall 8a between the dielectric fluid inlet 23 and a first dielectric fluid circulation point 25 that is located in line with the intermediate secondary wall 9c.

More specifically, the first dielectric fluid channel 24 may be formed by a stamped portion formed in the first shell 301 supporting the dielectric fluid inlet and by a flat surface of the second or third shell. As shown in FIG. 8, this first dielectric fluid channel 24, forming a portion of the second circuit 5, is arranged bordering the second manifold 18 of the first circuit 4, the stamped portion forming this first channel being in contact with the edge defining the second manifold. At least in this portion of the second circuit 5, the circuits are in thermal contact, calories being exchangeable, by thermal conduction via the walls of the circuits, between the fluids circulating in each of these circuits.

The first circulation point may be formed by two opposite stamped portions respectively formed in the walls of the second and third shells helping to form the intermediate secondary wall.

The first dielectric fluid circulation point 25 is in fluid communication with a second dielectric fluid channel 26 that extends inside the intermediate secondary wall 9c to a second dielectric fluid circulation point 27 located in the vicinity of the second lateral end of the main wall 8b. The second dielectric fluid channel 26 comprises two first dielectric fluid circulation branches 28 that are parallel to each other.

The second dielectric fluid circulation point 27 is in fluid communication with a third dielectric fluid channel 29 and a fourth dielectric fluid channel 30 that both extend along the second lateral end of the main wall 8b.

The third dielectric fluid channel 29 extends between the second dielectric fluid circulation point 27 and a fourth dielectric fluid circulation point 31 that is located in line with the first lateral secondary wall 9a.

The fourth dielectric fluid circulation point 31 is in fluid communication with a fifth dielectric fluid channel 33 that extends inside the first lateral secondary wall 9a and that comprises two second dielectric fluid circulation branches 34 that are parallel to each other. The second dielectric fluid circulation branches 34 extend from the second lateral end of the main wall 8b to the first lateral end of the main wall 8b.

The fourth dielectric fluid channel 30 extends between the second dielectric fluid circulation point 27 and a fifth dielectric fluid circulation point 32 that is in line with the second lateral secondary wall 9b.

As can be understood in particular from FIGS. 8 and 10, the third dielectric fluid channel 29 and the fourth dielectric fluid channel 30, respectively forming portions of the second circuit 5, are arranged bordering third manifold 20 of the first circuit 4, the stamped portion forming these third and fourth channels being in contact with the edge defining the third manifold. At least in these portions of the second circuit 5, the circuits are in thermal contact, calories being exchangeable, by thermal conduction via the walls of the circuits, between the fluids circulating in each of these circuits.

Inside the dielectric fluid circulation channels, the dielectric fluid 1 travels substantially the second distance D2, which allows the dielectric fluid to be sprayed over the whole of a first dimension, in this case the length, of the electronic components 103. Moreover, the fact that the circulation channels comprise a plurality of dielectric fluid circulation branches allows the dielectric fluid to be sprayed over different heights of the electronic components, respectively for a second dimension of the electronic components parallel to the stacking direction of the tiers, and therefore allows the operation for cooling the electronic component in question to be homogenized.

The fifth dielectric fluid circulation point 32 is in fluid communication with a sixth dielectric fluid channel 35 that extends inside the second lateral secondary wall 9b and that comprises two third dielectric fluid circulation branches 36 that are parallel to each other. The third dielectric fluid circulation branches 36 extend from the second lateral end of the main wall 8b to the first lateral end of the main wall 8b. Thus, the dielectric fluid 1 travels substantially the second distance D2 inside the sixth dielectric fluid channel 35.

Each dielectric fluid circulation branch 28, 34, 36 is equipped with a plurality of spray nozzles 37 for spraying dielectric fluid 1 toward the chamber 10a, 10b bordered by the secondary walls 9a, 9b, 9c. According to the example shown, each dielectric fluid circulation branch 28, 34, 36 is equipped with four spray nozzles 37. The number of spray nozzles 37 equipping a dielectric fluid circulation branch 28, 34, 36 may be different.

It should be noted that the first dielectric fluid circulation branches 28 are provided with a number of spray nozzles 37 that is equivalent to twice the number of spray nozzles 37 that respectively equip the second dielectric fluid circulation branches 34 and the third dielectric fluid circulation branches 36, for spraying dielectric fluid 1 toward the first chamber 10a and toward the second chamber 10b, due to the fact that the intermediate secondary wall 9c, which is equipped with the first dielectric fluid circulation branches 28, borders the two chambers 10a, 10b. It is understood that the spray nozzles 37 equipping the second dielectric fluid circulation branches 34 are intended to spray the dielectric fluid 1 toward the first chamber 10a and that the spray nozzles 37 equipping the third dielectric fluid circulation branches 36 are intended to spray the dielectric fluid 1 toward the second chamber 10b.

According to the alternative embodiment described above, the dielectric fluid circuit 5 is produced in the thickness of the main wall 6 of the condenser 3 and in the thickness of the secondary walls 9a, 9b, 9c of the condenser 3.

The description and the corresponding figures, in particular FIG. 9, clearly show the feature whereby the heat transfer fluid circuit 4 is only provided in the thickness of the main wall 6, and in a central zone 61, whereas the dielectric fluid circuit 5 is configured to leave this central zone clear and not interfere with the action of the condenser on the vaporized dielectric fluid. In particular, the dielectric fluid circuit may extend in the thickness of either or both of the secondary walls 9a, 9, 9c, and it may extend at the border of the main wall, in a peripheral zone 60.

The presence of the heat transfer fluid circuit 4 in the main wall 6, and in particular in the central zone 61 of this wall, makes it possible to envisage thermal interaction between this first circuit 4 and the dielectric fluid that may come into contact with this main wall 6 after being heated and in this case vaporized by the release of heat from the electronic component 103.

Furthermore, as mentioned above, the circuits are advantageously arranged in the main wall such that the portions of the second circuit 5 extending in the peripheral zone 60 are very close to a branch of the first circuit 4, in order to make possible heat exchange from one circuit to another. In light of the proximity of these circuits, it can be considered that there is thermal contact between the first and second circuits.

Further embodiments of the thermal regulation device according to the invention will now be described. In these embodiments, as can be seen in FIGS. 11 to 19, the condenser 3 does not have secondary walls, so that it mainly consists of a plate formed by the main wall 6. It should be noted that this is not limiting and that combinations of a dielectric fluid circuit as will be described below and a condenser with secondary walls as described above are to be considered in the context of the invention.

FIGS. 11 and 12 show a thermal regulation device according to a second embodiment, which differs from the above in that the second circuit 5, or dielectric fluid circuit, is fully incorporated in the plate, in this case the main wall 6, also incorporating the first circuit 4, or heat transfer fluid circuit.

As shown, the main wall 6 of the condenser 3 is in this case produced by joining, one on top of the other, two plates, with in this case a stamped plate 62 in which the branches of the first heat transfer fluid circuit and the second dielectric fluid circuit are produced and a flat plate 64 attached on the stamped plate so as to close off the branches and form the first and second circuits.

As shown, in the condenser plate 3, once the two previously described plates are joined, this second circuit extends in the central zone 61 of the condenser plate, and therefore in the heat transfer fluid flow zone. In order to manage the coexistence of these two circuits in the same plate, the second circuit 5 is U-shaped, nestled within the first circuit.

More particularly, the second circuit comprises a first segment 51 which comprises a first end opening into the dielectric fluid inlet 23 and a second segment 52 parallel to the first segment and extending in the direction of the first lateral end 8a of the plate, on which the dielectric fluid inlet is attached. The plate and the two circuits are arranged such that various branches of the heat transfer fluid circuit 4 extend between the segments 51, 52, such that the second segment 52 is sufficiently far from the first lateral end 8a of the plate to allow passage for a connecting branch of the heat transfer fluid circuit, and such that the branches connected to the heat transfer fluid inlet 12a and to the heat transfer fluid outlet 12b are arranged on either side of the first segment 51 of the second circuit 5.

It follows from the foregoing that the second dielectric fluid circuit 5 extends in the condenser plate 3 so as to be surrounded by branches forming part of the first heat transfer fluid circuit, and that thermal contact is thus created between the two circuits 4, 5. As may have been specified previously, this thermal contact is advantageous in that it allows a stage of sub-cooling of the dielectric fluid before it is sprayed onto the electronic components 103, the temperature of which must be regulated. In other words, the dielectric fluid circulating in the second circuit exchanges calories with the heat transfer fluid in the first circuit 4 so that its temperature is lowered, doing so before being sprayed onto the electronic components, which are thus more especially cooled.

It should be noted that in this arrangement, advantageous owing to the thermal contact between the circuits which it allows since the entire second circuit is in thermal contact with the first circuit, the heat transfer fluid circulates over a major part of the surface of the condenser plate 3, so that the thermal interaction between the first circuit and the fluid sprayed by the second circuit and vaporized by the heat given off by the electronic components is efficient.

Another feature of this second embodiment is that the dielectric fluid outlets are arranged on opposite faces of the condenser plate 3. More particularly, and as can be seen in FIG. 12, each outlet being in this case equipped with spray nozzles 37, a first series of spray nozzles 37 is arranged projecting from the first face 11a of the condenser plate 3, and a second series of spray nozzles 37 is arranged projecting from the second face 11b, opposite to the first face 11a, of the condenser plate 3. Spray nozzles are thus arranged on both sides of the condenser plate so as to be able to spray dielectric fluid onto electronic components arranged both above and below the condenser.

FIG. 13 shows a thermal regulation device according to a third embodiment, which differs from what has been described above for the second embodiment in the arrangement of the two circuits, these circuits again being incorporated in the same condenser plate.

In this third embodiment, the condenser plate 3 of the thermal regulation device 2 has a general shape similar to the main wall 6 described above but this time consisting of an intermediate wall 200, a cover 212 which is attached to a first face of this intermediate wall and a plurality of caps 222 which are attached to the second face, opposite to the first face, of this intermediate wall. Thus, the cover and the caps are secured on either side of the intermediate wall.

The intermediate wall 200 is stamped so as to have on each of the faces alternating depressions and bosses and, on the opposite face, alternating cavities 211 and hollows 221 extending in parallel along the transverse dimension, from one lateral end 8a of the condenser plate 3 to the other. Thus, the cavities and the hollows open out respectively on the first face 11a and on the second face 11b, and at least one plane passes through each of the cavities and each of the hollows.

The cover 212 is arranged to cover the first face 11a so as to cover each of the cavities, the cover having an internal face turned toward the first face of the intermediate wall. More particularly, the cover comprises ribs 230 protruding from the internal face configured to interact with the edges defining the cavities 211 of the intermediate wall, so as to ensure sealed circulation of the fluid present in the cavities.

The caps 222 are positioned in the hollows 221, with a clearance allowing the sealed circulation of fluid between the caps and the intermediate wall in the hollows 221.

It should be noted that, as can be understood from FIG. 13, the hollows 221 are in communication with each other and help form one of the circuits of the thermal regulation device, in this case the second dielectric fluid circuit 5. The caps 222 and/or the second face 11b of the intermediate wall at the hollows 221 comprise dielectric fluid outlets, not visible here in the sectional plane, to allow dielectric fluid to be sprayed in the direction of electronic components.

Similarly, the cavities 211 are in communication, from one to the next, and help form one of the circuits of the thermal regulation device, in this case the first heat transfer fluid circuit 4. An inlet and an outlet for heat transfer fluid are arranged on one edge of the intermediate wall to allow the circulation of heat transfer fluid in this first circuit 4.

The alternation of cavities and hollows, and therefore of the portions of the first circuit and of the second circuit, is such that a cavity and the directly adjacent hollow share a common wall defining them, which ensures thermal contact within the meaning of the invention between a portion of the first circuit and a portion of the second circuit.

A fourth embodiment will now be described, with reference to FIGS. 14 to 17, differing from the above in that the second dielectric fluid circuit 5 is formed by a conduit 400, or tube, produced separately from the condenser plate. In other words, the second circuit is not incorporated in the condenser plate.

As shown, the condenser is produced by joining, one on top of the other, two plates, with in this case a stamped plate 402 in which the branches of the first heat transfer fluid circuit are produced and a flat plate 404 attached on the stamped plate so as to close off the branches and form the first circuit.

The conduit 400 forming the second circuit, i.e. the conduit, in this case tubular, in which the dielectric fluid may circulate, is attached to the second face 11b of the condenser 3, in this case consisting of one face of the flat plate 404, which faces a chamber for receiving at least one electronic component. This conduit is more particularly visible in FIG. 16.

The conduit 400, in this case in the form of a tube 40 of circular section, may be made of a material different from that used to make the condenser plate 3, and it may in particular be made of aluminum.

The conduit forming the second circuit has, in this fourth embodiment, a substantially flat shape and is arranged in a plane parallel to the condenser plate 3. In FIG. 14, the tube 40 forming the conduit 400 is visible in transparency under the main wall 6 of the condenser plate 3.

The dielectric fluid 1 is sprayed from the fluid outlets of the second circuit 5, away from the condenser plate 3 incorporating the first circuit 4. These outlets may be equipped with spray nozzles 37, which may be oriented to spray the dielectric fluid onto either side of the electronic components 103 the temperature of which is to be regulated. In accordance with the above, the first circuit 4 is in thermal interaction with the dielectric fluid leaving the second circuit 5 and vaporized by the heat given off by the electronic components, in that the first circuit exchanges calories with the vapor coming into contact with the condenser plate.

The thermal regulation device 2 comprises a dielectric fluid inlet end 23 rigidly secured to the conduit forming the second circuit, and a heat transfer fluid inlet and outlet connected to the heat transfer fluid circuit. In this fourth embodiment, the dielectric fluid inlet end 23 arranged at a free end of the conduit helping to form the second circuit is rigidly secured to the condenser plates 3.

More particularly, the dielectric fluid inlet end 23 is fitted into an orifice 406 formed in the condenser, in this case in the flat plate forming the condenser and in particular at a lateral protuberance 408 such that, as can be seen in FIG. 14, this protuberance and the dielectric fluid inlet end passing through it protrude laterally from the stamped plate forming the condenser.

The condenser incorporating the first circuit and the conduit, in this case tubular, defining the second circuit, thus form an integral assembly, which may be subsequently added to the system of electronic components. In order to ensure that the thermal regulation device comprising the two circuits is in one piece, in other words to ensure that the two elements which make up this thermal regulation device are inseparable without breaking one of them, brazing may be performed to ensure the dielectric fluid inlet end is firmly attached to the condenser.

Note that the low weight of the conduit, which is in this case tubular, does not in any way restrict the attachment by brazing and that when the thermal regulation device is handled, the tubular conduit 400 forming the second circuit stays at a constant distance from the condenser, preferably against the corresponding face of the condenser. The second circuit 5 is thus sufficiently close to the first circuit, in particular at a distance of less than 10 mm, for it to be considered, in accordance with what has been described above, that the two circuits 4, 5 are in thermal contact with each other. Furthermore, once again, the thermal regulation device 2 is arranged in a thermal regulation assembly, facing electronic components 103 in particular, such that the first circuit, or heat transfer fluid circuit 4, is in thermal interaction with the dielectric fluid sprayed from the conduit 400, which is in this case in the form of a tube 40, toward the electronic components and vaporized by the release of heat from these components when they are in operation.

In the example shown in FIG. 15, securing studs 410 are also provided, arranged between the conduit 400 defining the second dielectric fluid circuit 5 and the condenser plate 3. The main dimension of these securing studs thus defines the gap between the first circuit 4 and the second circuit 5, the latter not being directly pressed against the condenser plate 3 incorporating the first circuit 4.

Preferably, the main dimension of the securing studs 410 is less than 10 mm, in order to ensure proximity of the circuits to one another.

It follows from the above that in accordance with what has been described above, the thermal regulation device according to the fourth embodiment is configured so that there is thermal contact between the circuits. If securing studs are present, these are made of a material capable of conducting calories from one circuit to the other, and they are dimensioned so that a minimal distance is provided between the two circuits, which makes it possible to estimate that there is the equivalent of thermal contact between the two, as stated above.

In this fourth embodiment, the tube 40 forming the conduit 400 for the dielectric fluid is arranged in a flat coil which comprises first tube portions 40a parallel to the longitudinal ends of the main wall 7a, 7b and second tube portions 40b along the lateral ends of the main wall 8a, 8b, at least a first tube portion 40a being interposed between two second tube portions 40b and at least one second tube portion 40b being interposed between two first tube portions 40a. Note that, in FIG. 16, the second tube portions 40b are alternately provided in the vicinity of the first lateral end of the main wall 8a and the second lateral end of the main wall 8b.

FIG. 17 shows an alternative of the fourth embodiment of the thermal regulation device, which differs from what has just been described in that the second tube portions 40b are formed near the first lateral end of the main wall 8a, the second dielectric fluid circuit having a comb shape with the first tube portions 40a forming teeth parallel to each other.

This alternative also differs in that the conduit is formed by a flat tube, i.e. a tube with a rectangular section different from the circular section described above, and in that this conduit is placed against the condenser plate in grooves provided for this purpose. During the brazing operation in which the circuits are rigidly secured to one another to form a one-piece assembly, the arrangement of the tube in the bottom of the groove makes it possible to ensure that the tube is firmly attached and therefore to improve the thermal contact between the two circuits.

FIG. 18 shows a fifth embodiment in which the conduit 400 of the second circuit is formed by a bent tube which comprises lateral portions 420 that can run along the lateral faces of the electronic components 103.

In this context, the tube has lateral portions which extend substantially perpendicular to the plane in which the condenser plate extends. According to this fifth embodiment, the thermal regulation device 2 is in this case equipped with two dielectric fluid circuits 5 that extend at a distance from the second face 11b of the main wall 6, opposite the first face 11a. Each dielectric fluid circuit 5 is produced, for example, from a tube 40 that partially extends in two tube planes P1, P2. Thus, each dielectric fluid circuit 5 comprises at least one first circuit portion 41 that extends in a first plane P1 and a second circuit portion 42 that extends in a second plane P2, the first plane P1 being interposed between the main wall 6 and the second plane P2, with the distances provided between the main wall 6 and the first plane P1, on the one hand, and between the first plane P1 and the second plane P2, on the other hand, being non-zero. The first circuit portion 41 and the second circuit portion 42 of the same dielectric fluid circuit 5 are connected together by means of at least one third circuit portion 43 that extends along an axis orthogonal to the first plane P1 and to the second plane P2. Mechanical reinforcements 44 extend between the first circuit portion 41 and the second circuit portion 42 of the same dielectric fluid circuit 5 in order to ensure the robustness of each dielectric fluid circuit 5. These arrangements are such that each tube 40 is arranged as a coil that extends in a volume bordered at least by the main plate 6 and the second plane P2. The tube 40 is provided with a plurality of spray nozzles 37 oriented toward the first chamber 10a or the second chamber 10b that are at least partially defined by an intermediate arrangement 45 of an element of a first circuit portion 41 and an element of a second circuit portion 42 one above the other, with the intermediate arrangement 45 being interposed between two respective lateral arrangements 46 of an element of a first circuit portion 41 and an element of a second circuit portion 42 one above the other, these lateral arrangements forming said lateral portions 420 of the bent tube.

FIG. 19 shows a sixth embodiment in which the first circuit, i.e. the heat transfer fluid circuit, differs from what has been described above and no longer fits into the thickness of a solid plate against or in which the second circuit is attached.

More particularly, the first circuit is in this case produced by means of a tube exchanger, with a plurality of tubes arranged parallel to each other between two heat transfer fluid inlet and outlet manifolds, the tubes of the exchanger being spaced apart from one another.

The conduit delimiting the second circuit is in this case identical to what has been described and shown for the fourth embodiment. In accordance with what has been described above, the second circuit is rigidly secured, by welding, brazing or adhesive bonding for example, to the exchanger forming the first circuit, so that these circuits are in thermal contact with each other, the first circuit being in thermal interaction with the fluid leaving the second circuit.

FIG. 20 shows various arrangements of a thermal regulation assembly, with a thermal regulation device associated with two electrical components the temperature of which must be regulated by spraying dielectric fluid. FIGS. 20a to 20f show a condenser similar to what has been described for the first embodiment and FIGS. 20g and 20h show a condenser similar to what has been described for the fourth embodiment for example, but the type of condenser does not limit the choice of such or such arrangement.

Figure 20A:
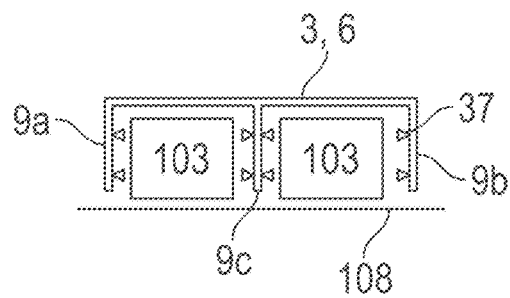

FIG. 20a focuses in particular on a device in which the first heat transfer fluid circuit is advantageously arranged in the main wall 6, above the electronic components, and in which the second dielectric fluid circuit, and at least the spray nozzles 37, is arranged laterally to these components, in this case in the secondary walls 9a, 9b, oc. The two circuits are arranged relative to one another such that the first circuit is at least in thermal interaction with the fluid leaving the second circuit and evaporated by the release of heat from the electronic components. Furthermore, the second circuit is arranged close enough to the first circuit for it to be considered that the two circuits are in thermal contact and that sub-cooling of the dielectric fluid is thus possible as it leaves the second circuit. When the thermal regulation assembly is in place in the vehicle, the main wall forming the condenser is arranged above the electronic components. A recovery tray common to the two electronic components is provided under these components.

Figure 20B:
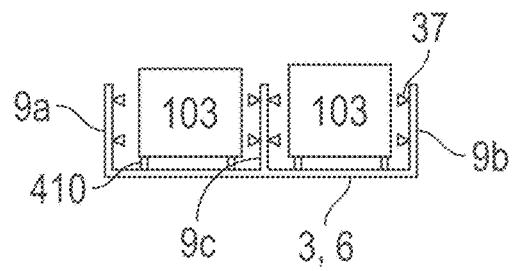

FIG. 20b shows a reverse arrangement, in which the main wall forming the condenser is arranged below the electronic components. Once again, the second dielectric fluid circuit, and at least the spray nozzles 37, is arranged laterally to these components, in this case in the secondary walls 9a, 9b, 9c. The two circuits are arranged relative to one another such that the first circuit is at least in thermal interaction with the part of the fluid leaving the second circuit and flowing by gravity along the electronic components. Furthermore, the second circuit is arranged close enough to the first circuit for it to be considered that the two circuits are in thermal contact and that sub-cooling of the dielectric fluid is thus possible as it leaves the second circuit. In this configuration, it may not be necessary to provide a tray, as the fluid may be recovered along the main wall 6. Securing studs 420 are in this case placed between the main wall and the electronic components.

Figure 20C:
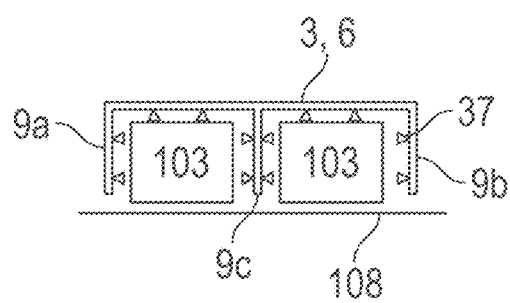
Figure 20D:
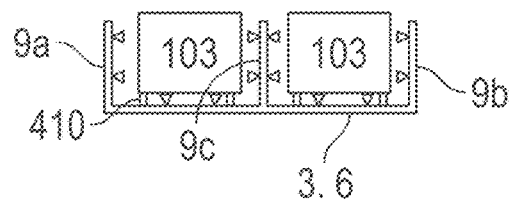

FIGS. 20c and 20d show arrangements which are similar to those of FIGS. 20a and 20b, respectively, with an additional dielectric fluid spray zone, namely a zone included in the main wall 6 where the first heat transfer fluid circuit extends.

Figure 20E:
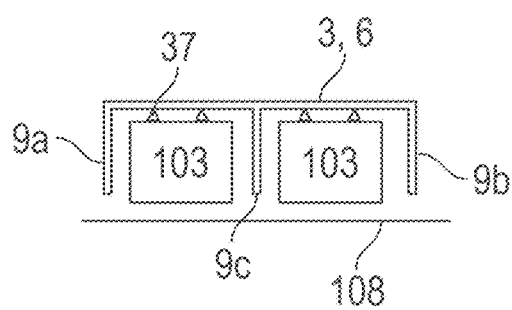
Figure 20F:
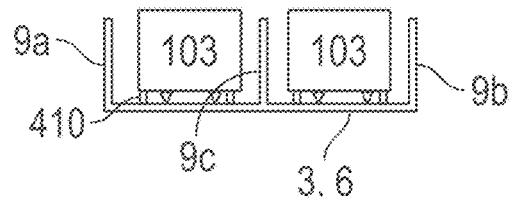

FIGS. 20e and 20f show arrangements which differ from the above in that the heat transfer fluid in this case circulates only in the secondary walls, laterally to the electronic components, while the dielectric fluid and the corresponding spray nozzles are arranged above or below the electronic component the temperature of which is to be regulated.

Figure 20G:
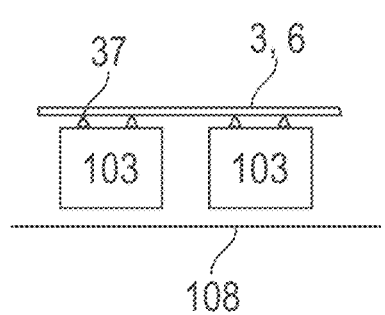
Figure 20H:
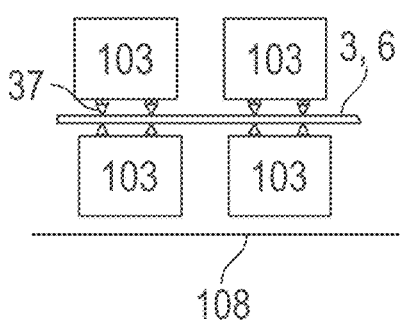

FIGS. 20g and 20h show arrangements which have been mentioned in the description of the third embodiment, with the spray nozzles 37 arranged on either side of the main wall 6 of the condenser. FIG. 20g shows an arrangement in which all of the nozzles are oriented in the same direction, and at least all in the direction of the electrical component(s) the temperature of which must be regulated and which are covered by the condenser. FIG. 20h shows an arrangement in which the nozzles are, in this case equally without this limiting the invention, arranged on either side of the condenser plate, a first part of the spray nozzles being opposite first electronic components arranged under the condenser plate and a second part of the spray nozzles being opposite second electronic components arranged above the condenser plate.

The invention claimed is:

1. A thermal regulation device for thermally regulating electronic components giving off heat during operation, the thermal regulation device comprising:
   at least one first circuit configured to allow a circulation of a heat transfer fluid; and at least one second circuit configured to convey a dielectric fluid, wherein the at least one second circuit comprises at least one outlet that distributes the dielectric fluid in a direction of the electronic components;

at least one plate incorporating the at least one first circuit to form at least one condenser plate configured to liquefy the dielectric fluid, wherein the at least one condenser plate is formed of two separate shells placed against one another; and at least one plate incorporating the at least one second circuit and identical to the at least one plate incorporating the at least one first circuit;

wherein the thermal regulation device is configured such that at least a portion of the at least one first circuit and at least a portion of the at least one second circuit are in thermal contact with each other.

2. The thermal regulation device as claimed in claim 1, wherein the at least one second circuit extends within the at least one condenser plate such that it is surrounded by branches forming part of the at least one first circuit.

3. The thermal regulation device as claimed in claim 1, wherein the at least one second circuit is formed in a peripheral zone of the at least one condenser plate, such as to leave clear a central zone of the at least one condenser plate for the at least one first circuit.

4. The thermal regulation device as claimed in claim 1, wherein the at least one first circuit and the at least one second circuit are arranged on either side of the at least one condenser plate, which comprises on a first face a plurality of cavities and on an opposite face a plurality of hollows, said plurality of cavities and hollows being covered by at least one cover and at least one cap respectively, so that the plurality of cavities, respectively the hollows, form the at least one first circuit and the at least one second circuit, respectively.

5. The thermal regulation device as claimed in claim 1, wherein the at least one plate incorporating the at least one second circuit is secant to the at least one plate incorporating the at least one first circuit.

6. The thermal regulation device as claimed in claim 1, wherein at least one of the two separate shells comprises a boss which defines a cavity forming part of the at least one first circuit or part of the at least one second circuit.

7. The thermal regulation device as claimed in claim 1, wherein at least one condenser plate comprises:

at least one main wall provided with a dielectric fluid inlet as well as a heat transfer fluid inlet and a heat transfer fluid outlet, between which the at least one first circuit extends; and a plurality of secondary walls projecting from the at least one main wall, including a first lateral secondary wall provided at a first longitudinal end of the at least one main wall, a second lateral secondary wall provided at a second longitudinal end of the at least one main wall and an intermediate secondary wall that is interposed between the first lateral secondary wall and the second lateral secondary wall, the intermediate secondary wall helping to define, with part of the at least one main wall and one of the first lateral secondary wall and the second lateral secondary wall, two chambers for receiving electronic components.

8. The thermal regulation device as claimed in claim 7, wherein the at least one first circuit is formed at least in the at least one main wall.

9. The thermal regulation device as claimed in claim 7, wherein the at least one second circuit is formed in at least one secondary wall.

10. The thermal regulation device as claimed in claim 1, wherein each of the at least one outlet has a spray nozzle, each spray nozzle is oriented toward one of the electronic components.

11. The thermal regulation device as claimed in claim 10, wherein spray nozzles are placed on each of the opposite faces of at least one condenser plate.

12. The thermal regulation device as claimed in claim 1, wherein the at least one second circuit is formed by a conduit produced separately from the at least one condenser plate and attached to a face of the at least one condenser plate which faces a chamber for receiving at least one the electronic components.

13. The thermal regulation device as claimed in claim 12, wherein the conduit forming the at least one second circuit has a dielectric fluid inlet end which is rigidly secured to the at least one condenser plate by brazing.

14. The thermal regulation device as claimed in claim 12, wherein the conduit forming the at least one second circuit is secured to the at least one condenser plate by securing studs.

15. The thermal regulation device as claimed in claim 12, wherein the conduit forming the at least one second circuit has a substantially flat shape, and is arranged in a plane parallel to the at least one condenser plate.

16. The thermal regulation device as claimed in claim 12, wherein the conduit forming the at least one second circuit has bent portions extending in a plane substantially perpendicular to the plane of the at least one condenser plate.

17. The thermal regulation device as claimed in claim 1, wherein the at least one first circuit and the at least one second circuit are respectively formed by a conduit arranged in a vicinity of a corresponding electronic component.

18. A thermal regulation assembly comprising:

the thermal regulation device as claimed in claim 1;

the electronic components stacked in a stacking direction and associated with the at least one first circuit and the at least one second circuit;

wherein the thermal regulation device comprises a recovery tray provided with a discharge pipe arranged in an extension of the electronic components in the stacking direction and configured to receive the dielectric fluid coming from each condenser; and wherein the thermal regulation device comprises a recirculation duct, in fluid communication with the discharge pipe, equipped with a pump for conveying the dielectric fluid to at least one dielectric fluid inlet of the at least one second circuits.

\* \* \* \* \*